(12) United States Patent
Dijaili et al.

(10) Patent No.: US 6,512,629 B1
(45) Date of Patent: Jan. 28, 2003

(54) LOW-NOISE, HIGH-POWER OPTICAL AMPLIFIER

(75) Inventors: Sol P. Dijaili, Moraga, CA (US); Jeffrey D. Walker, El Cerrito, CA (US)

(73) Assignee: Genoa Corporation, Fremont, CA (US)

( * ) Notice: Subject to any disclaimer, the term of this patent is extended or adjusted under 35 U.S.C. 154(b) by 0 days.

(21) Appl. No.: 09/416,817

(22) Filed: Oct. 12, 1999

Related U.S. Application Data

(63) Continuation-in-part of application No. 09/273,813, filed on Mar. 22, 1999, now Pat. No. 6,445,495.

(51) Int. Cl.[7] .............................................. H01S 3/00
(52) U.S. Cl. ...................................................... 359/344
(58) Field of Search ........................... 359/344; 372/40, 372/41, 42, 43, 44, 45, 46, 47, 48, 49, 50

(56) References Cited

U.S. PATENT DOCUMENTS

| | | | |
|---|---|---|---|
| 3,467,906 A | | 9/1969 | Cornely et al. ............... 330/4.3 |
| 3,828,231 A | | 8/1974 | Yamamoto .................... 357/30 |
| 4,794,346 A | | 12/1988 | Miller .......................... 330/4.3 |
| 5,331,654 A | * | 7/1994 | Jewell et al. .................. 372/45 |
| 5,371,757 A | * | 12/1994 | Largent ....................... 359/344 |
| 5,436,759 A | | 7/1995 | Dijaili et al. ................ 359/333 |
| 5,457,569 A | * | 10/1995 | Liou et al. ................... 359/344 |
| 5,539,571 A | * | 7/1996 | Welch et asl. .............. 359/344 |
| 5,793,521 A | * | 8/1998 | O'Brien et al. ............. 359/344 |
| 6,040,938 A | * | 3/2000 | Ducellier .................... 359/344 |

FOREIGN PATENT DOCUMENTS

| | | | | |
|---|---|---|---|---|
| JP | 56006492 | 1/1981 | ............. | H01S/3/18 |
| JP | 01129483 | 11/1987 | ............. | H01S/3/18 |
| JP | 10190147 | 7/1998 | ............. | H01S/3/18 |

OTHER PUBLICATIONS

Liu et al., "Effect of saturation caused by amplified spontaneous emission on semiconductor optical amplifier performance", Electronics Letters, Nov. 20th 1997, Vo. 33, No. 24, pp. 2042–2043.*

Dagens et al., "Dynamical simulation of flatred semiconductor amplifiers for repetitive picosecond pulse amplification", Semiconductor Laser Conference, 1996, Oct. 13–18 1996, pp. 165–166.*

Shin et al. Anomalous above–threshold spontaneous emission in gain–guided vertical–cavity surface–emitting lasers. Appl. Phys Lett. 68 (16). Apr. 15 1996. pp. 2180–2182.*

Koyama, F., et al., "Multiple–Quantum–Well GaInAs/GaInAsP Tapered Broad–Area Amplifiers with Monolithically Integrated Waveguide Lens for High–Power Applications," *IEEE Photonics Technology Letters* (Aug. 1993), vol. 5, No. 8, pp. 916–919.

(List continued on next page.)

*Primary Examiner*—Thomas H. Tarcza
*Assistant Examiner*—Deandra M. Hughes
(74) *Attorney, Agent, or Firm*—Fenwick & West LLP

(57) ABSTRACT

A multi-stage lasing semiconductor optical amplifier (SOA) device amplifies an optical signal. The multi-stage SOA includes at least two SOA stages coupled in series. Each SOA stage includes a semiconductor gain medium and a laser cavity including the semiconductor gain medium. The medium is pumped above a lasing threshold for the laser cavity, which clamps the gain of the medium. An optical signal propagating through the medium is amplified by the gain-clamped medium. The SOA stages are characterized by a design parameter which varies from stage to stage. In a preferred embodiment, the design parameter includes a noise figure and a saturable power, with both parameters increasing as the optical signal propagates from stage to stage. As a result, the multi-stage SOA can achieve better noise performance and higher power outputs compared to comparable SOAs of constant noise figure and saturable power.

37 Claims, 16 Drawing Sheets

OTHER PUBLICATIONS

Alcatel, "Alcatel Optronics introduces a Gain–Clamped Semiconductor Optical Amplifier," *Press Release for Immediate Publication*, OFC '98, San Jose (Feb. 1998), 1 unnumbered page.

Bauer, B. et al., "Gain Stabilization of a Semiconductor Optical Amplifier by Distributed Feedback," *IEEE Photonics Technology Letters*, vol. 6, No. 2 (Feb. 1994), pp. 182–185.

Doussiere, P. et al., "Clamped Gain Travelling Wave Semiconductor Optical Amplifier for Wavelength Division Multiplexing Applications," Maui, Hawaii, Sep. 19–23, 1994, New York, IEEE, US, vol. Conf. 14 (Sep. 14, 1994), pp. 185–186.

Gee, S. et al., "High–Power Mode–Locked External Cavity Semiconductor Laser Using Inverse Bow–Tie Semiconductor Optical Amplifiers," *IEEE Journal of Selected Topics in Quantum Electronics*, vol. 4, No. 2, Mar./Apr. 1998, pp. 209–215.

McAdams, L.R. et al., "Linearizing High Performance Semiconductor Optical Amplifiers: Techniques and Performance," LEOS Presentation (1996), pp. 363–364.

Mutalik, V.G. et al., "Analog performance of 1310–nm gain–clamped semiconductor optical amplifiers," *OFC '97 Technical Digest*, Thursday Morning, 11:15 AM, pp. 266–267.

Simon, J.C. et al., "Travelling wave semiconductor optical amplifier with reduced nonlinear distortions," *Electronics Letters*, vol. 30, No. 1 (Jan. 6, 1994), pp. 49–50.

Soulage, G. et al., "Clamped Gain Travelling Wave Semiconductor Optical Amplifier as a Large Dynamic Range Optical Gate," Alcatel Alsthom Recherche, route de Nozay, 91460 Marcoussis, France, undated, 4 unnumbered pages.

Tiemeijer, L.F. et al., "1310–nm DBR–Type MQW Gain–Clamped Semiconductor Optical Amplifiers with AM–CATV–Grade Linearity," *IEEE Photonics Technology Letters*, vol. 8, No. 11 (Nov. 1996), pp. 1453–1455.

Tiemeijer, L.F. et al., "High–Gain 1310 nm Semiconductor Optical Amplifier Modules with a Built–in Amplified Signal Monitor for Optical Gain Control," *IEEE Photonics Technology Letters*, vol. 9, No. 3 (Mar. 1997), pp. 309–311.

Tiemeijer, L.F. et al., "Reduced Intermodulation Distortion in 1300 nm Gain–Clamped MQW Laser Amplifiers," *IEEE Photonics Technology Letters*, vol. 7, No. 3, (Mar. 1995), pp. 284–286.

Walker, J.D. et al., "A Gain–Clamped, Crosstalk Free, Vertical Cavity Lasing Semiconductor Optical Amplifier for WDM Applications," summaries of the papers presented at the topical meeting, Integrated Photonics Search; 1996 Technical Digest Series; Proceedings of Integrated Photonics; Boston, MA, USA, 29.04–02.05 1996, vol. 6, 1996, pp. 474–477.

* cited by examiner

LOW-NOISE, HIGH-POWER OPTICAL AMPLIFIER

CROSS-REFERENCE TO RELATED APPLICATION

This application is a continuation-in-part of co-pending U.S. patent application Ser. No. 09/273,813, "Tunable-gain Lasing Semiconductor Optical Amplifier", by Jeffrey D. Walker, Sol P. Dijaili and Daniel A. Francis, filed Mar. 22, 1999 and issued on Sep. 3, 2002 as U.S. Pat. No. 6,445,495, which subject matter is incorporated herein by reference.

BACKGROUND OF THE INVENTION

1. Field of the Invention

The present invention relates to optical communications systems and, more particularly, to lasing semiconductor optical amplifiers.

2. Description of the Related Art

As the result of continuous advances in technology, particularly in the area of networking such as the Internet, there is an increasing demand for communications bandwidth. For example, the transmission of data over a telephone company's trunk lines, the transmission of images or video over the Internet, the transfer of large amounts of data as might be required in transaction processing, or videoconferencing implemented over a public telephone network typically require the high speed transmission of large amounts of data. As applications such as these become more prevalent, the demand for communications bandwidth capacity will only increase.

Optical fiber is a transmission medium that is well-suited to meet this increasing demand. Optical fiber has an inherent bandwidth which is much greater than metal-based conductors, such as twisted pair or coaxial cable; and protocols such as the OC protocol have been developed for he transmission of data over optical fibers. Typical communications system based on optical fibers include a transmitter, an optical fiber, and a receiver. The transmitter converts the data to be communicated into an optical form and then transmits the resulting optical signal via the optical fiber to the receiver. The receiver recovers the original data from the received optical signal.

Optical amplifiers, which boost the power of the optical signal propagating through the optical fiber, are an important component in such fiber communications systems. For example, receivers typically operate properly only within a relatively narrow range of optical signal power levels; optical amplifiers can be used to boost the received optical signal to the proper power range for the receiver. As another example, phenomena such as fiber losses, losses due to insertion of components in the transmission path, and splitting of the optical signal may attenuate the optical signal and degrade the corresponding signal-to-noise ratio as the optical signal propagates through the communications system. Optical amplifiers may be used to compensate for these attenuations. Conventional optical amplifiers, however, suffer from various drawbacks.

Fiber amplifiers are one type of conventional optical amplifier. They include a length of fiber which has been doped to form an active gain medium. Ions of rare-earth metals, such as erbium, are typically used as the dopant. The doped fiber is typically pumped by an optical pump at a wavelength which is preferentially absorbed by the ions but different from the wavelength of the optical signal to be amplified. The pumping results in a population inversion of electronic carriers in the active medium. Then, as the optical signal propagates through the doped fiber, it is amplified due to stimulated emission.

One drawback of fiber amplifiers is that they typically can only operate over a narrow wavelength range when multiple fiber amplifiers are cascaded. This is especially problematic if the optical signal to be amplified covers a wide range of wavelengths, as would be the case if the entire bandwidth of the optical fiber is to be efficiently utilized. Another disadvantage of fiber amplifiers is their transient response to channel drop-out in wavelength division multiplexing systems. Further problems with fiber amplifiers include their relatively large size, slow switching speed, power inefficiency, difficulties in mass producing them, and their high cost which makes them prohibitively expensive for many applications.

Non-lasing semiconductor optical amplifiers (SOAs) are an alternative to fiber amplifiers. Non-lasing semiconductor optical amplifiers are typically based on a semiconductor laser-like structure which is operated below the lasing threshold. Typically, an electrical current pumps the active region of the amplifier, resulting in an increased carrier population. The optical signal then experiences gain as it propagates through the active region due to stimulated emission.

One problem with non-lasing semiconductor optical amplifiers is that the gain depends on the amplitude of the optical signal. For example, a strong optical signal will be amplified less than a weak signal and strong portions of the optical signal will be amplified less than weak portions. This results in distortion of the optical signal and possibly also crosstalk between different optical signals propagating simultaneously through the system. This problem is the result of gain saturation, in which there are insufficient carriers in the conduction band to provide the full amount of gain to higher power signals.

Lasing semiconductor optical amplifiers can overcome the problem of gain saturation. These amplifiers are also based on a semiconductor active region. However, the active region is pumped above the lasing threshold. The gain is then clamped due to the lasing action and is fairly constant until the amplifier reaches its power limit.

However, lasing semiconductor optical amplifiers also suffer from inherent drawbacks. For example, there is an inherent tradeoff between noise performance and power output. If the carrier density at the lasing threshold is high, the amplifier will have good noise performance but will have a low saturable power thus limiting its power output. On the other hand, an amplifier with a low carrier density at the lasing threshold will be capable of large power output but suffer from poor noise performance. This inherent tradeoff makes it difficult for a lasing semiconductor optical amplifier to attain both a low noise and a high power output.

Thus, there is a need for an optical amplifier which does not suffer from gain saturation and is also capable of both low noise and high power output.

SUMMARY OF THE INVENTION

In accordance with the present invention, a multi-stage lasing semiconductor optical amplifier (SOA) device for amplifying an optical signal includes at least two SOA stages coupled in series. Each SOA stage includes a semiconductor gain medium, a laser cavity including the semiconductor gain medium, and a pump input to the semiconductor gain medium. The semiconductor gain medium has an amplifying path along which the optical signal to be amplified propagates. The pump input receives a pump which pumps the semiconductor gain medium above a lasing threshold for the laser cavity. The onset of lasing clamps a gain of the semiconductor gain medium to a gain value which is substantially independent of the amplitude of the optical signal and the optical signal is amplified as it propagates through the semiconductor gain medium. The SOA stages are characterized by a design parameter which varies from stage to stage. The design parameter preferably includes a noise figure and a saturable power for each SOA stage, with both parameters increasing from stage to stage.

In a preferred embodiment, the optical signal propagates along the semiconductor gain medium, which forms part of a waveguide. The laser cavity in each SOA stage includes a first and a second Bragg reflector disposed to form a laser cavity oriented vertically with respect to the amplifying path. The reflectivity of the Bragg reflectors increases from stage to stage and, accordingly, the noise figure and the saturable power also increase from stage to stage. The semiconductor gain medium is pumped by a pump current injected via an electrical contact and these preferably are multiple electrical contacts for each SOA stage.

In further accordance with the invention, a method for amplifying an optical signal utilizes a multi-stage lasing semiconductor optical amplifier (SOA) device comprising at least two SOA stages, each SOA stage including a semiconductor gain medium and a laser cavity including the semiconductor gain medium. The method includes the following steps. The optical signal to be amplified is received. For each SOA stage, the optical signal propagates along an amplifying path in the semiconductor gain medium. The semiconductor gain medium is pumped above a lasing threshold for the laser cavity, whereby a gain of the semiconductor gain medium is clamped to a gain value which is substantially independent of the amplitude of the optical signal. The optical signal is amplified as it propagates along the amplifying path. The amplification is responsive to the gain value of the semiconductor gain medium and to a value for a design parameter for each SOA stage. Furthermore, the value of the design parameter varies from stage to stage.

In another aspect of the invention, a varying lasing SOA device for amplifying an optical signal includes a semiconductor gain medium, a laser cavity, and a pump input. The semiconductor gain medium has an amplifying path and the optical signal is amplified as it propagates along the amplifying path. The laser cavity includes the semiconductor gain medium. The laser cavity is off-axis with respect to the amplifying path and varies along the amplifying path. The pump input is coupled to the semiconductor gain medium. A pump received via the pump input pumps the semiconductor gain medium above a lasing threshold for the laser cavity, whereby a gain of the semiconductor gain medium is clamped to a gain value which is substantially independent of the amplitude of the optical signal. In a preferred embodiment, the noise figure and saturable power for the laser cavity increases monotonically along the amplifying path.

The present invention is particularly advantageous because the use of multiple SOA stages characterized by different design parameters and/or the variation of the laser cavity along the amplifying path results in increased flexibility in the design of the lasing SOA device. For example, by allowing the noise figure and saturable power to vary from stage to stage, better noise performance and higher saturable power for the lasing SOA device can be achieved.

BRIEF DESCRIPTION OF THE DRAWING

The invention has other advantages and features which will be more readily apparent from the following detailed description of the invention and the appended claims, when taken in conjunction with the accompanying drawing, in which:

DETAILED DESCRIPTION OF THE PREFERRED EMBODIMENTS

Figure 1:
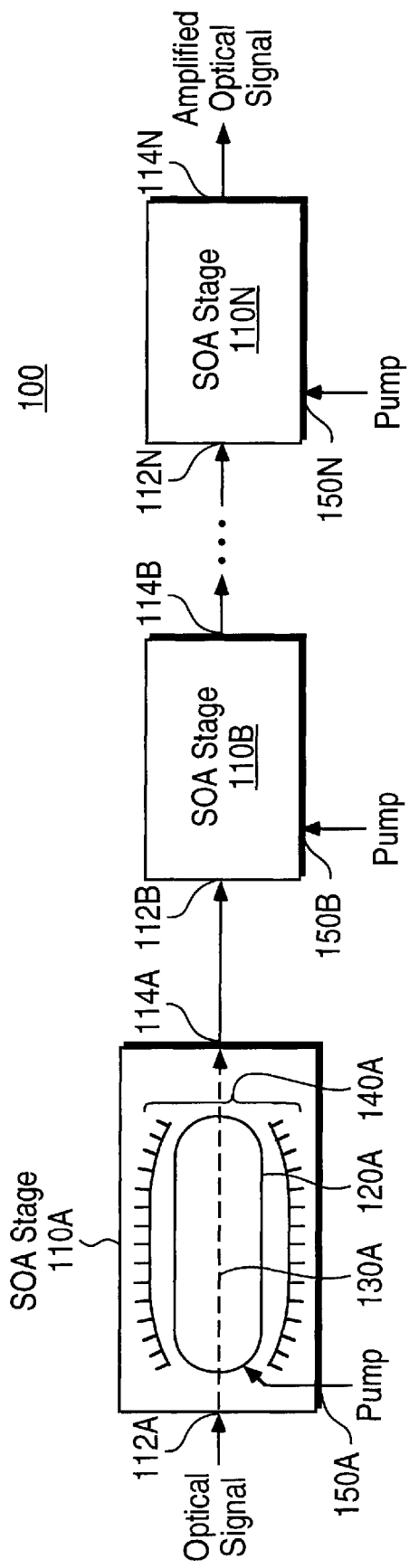
FIG. 1 is a diagram of a multi-stage lasing semiconductor optical amplifier (SOA) 100 in accordance with the present invention.

FIG. 1 is a diagram of a multi-stage lasing semiconductor optical amplifier (SOA) 100 in accordance with the present invention. The SOA 100 includes a number of SOA stages 110A–110N (collectively, SOA stages 110). Each SOA stage 110 has an input 112 and an output 114 and the SOA stages 110 are coupled in series with the output of each SOA stage 110 coupled to the input of the next SOA stage 110. As shown in the detail of SOA stage 110A, each SOA stage 110 includes a semiconductor gain medium 120, with an amplifying path 130 coupled between the input 112 and the output 114 of the SOA stage 110 and traveling through the semiconductor gain medium 120. Each SOA stage 110 further includes a laser cavity 140 including the semiconductor gain medium 120, and a pump input 150 coupled to the semiconductor gain medium 120. The pump input is for receiving a pump to pump the semiconductor gain medium 120 above a lasing threshold for the laser cavity 140. The SOA stages 110 are not identical in that the SOA stages 110 may be described by design parameters and the value of at least one design parameter differs from stage to stage. This results in significant advantages over SOAs which are constructed of identical stages, as will be apparent below.

Figure 2:
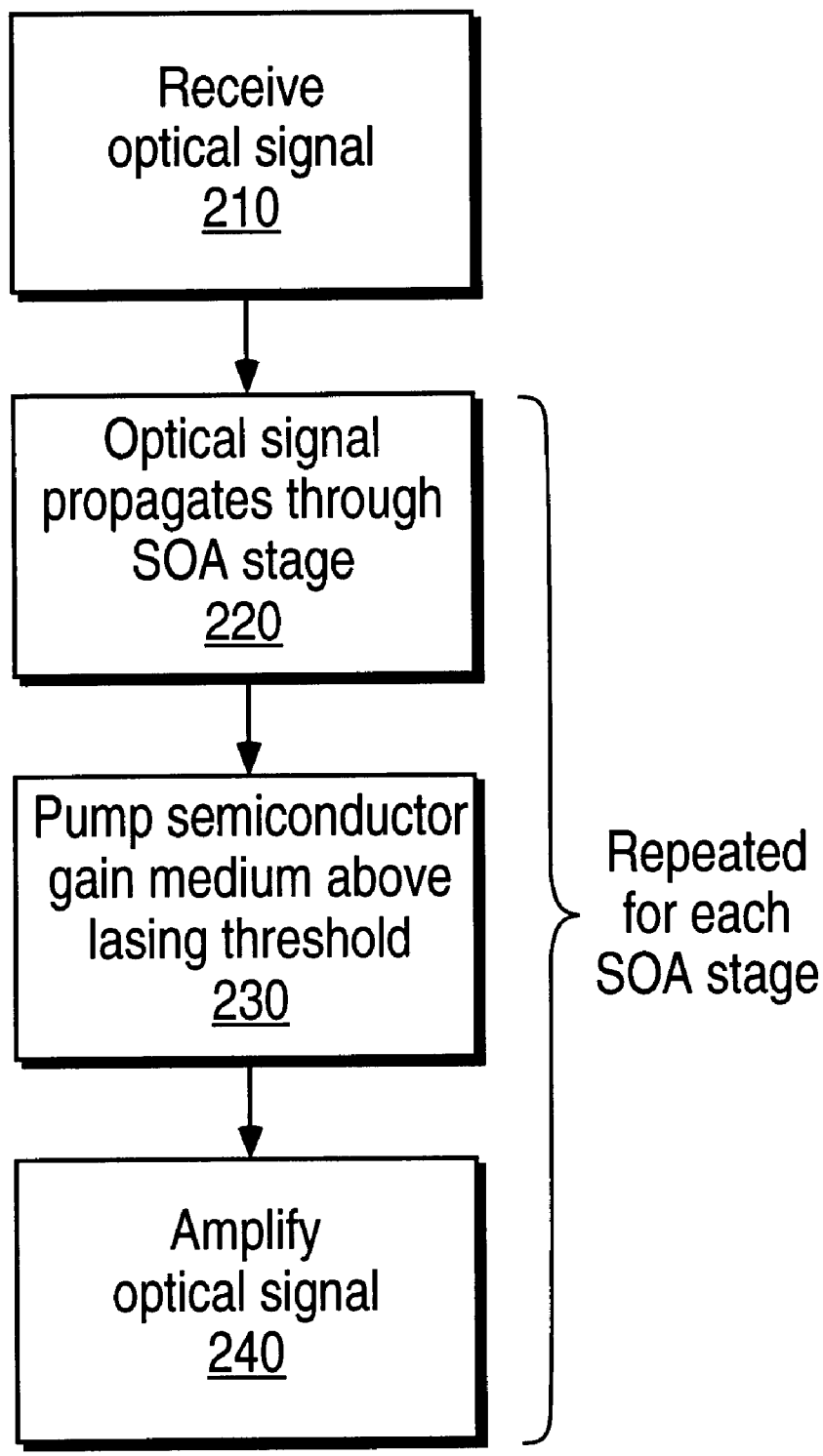
FIG. 2 is a flow diagram illustrating operation of SOA 100.

Overall, the SOA 100 receives an optical signal at the first input 112A, amplifies the optical signal as it propagates through the SOA 100 along the amplifying paths 130, and outputs the amplified optical signal from the last output 114N. FIG. 2 is a flow diagram illustrating operation of SOA 100 in more detail. The SOA 100 receives 210 an optical signal at the input 112A of the first SOA stage 110A. The optical signal propagates 220 through the first SOA stage 110A along the amplifying path 130A. The pump received at pump input 150A pumps 230 the semiconductor gain medium 120A of the first SOA stage 110A above a lasing threshold for the laser cavity 140A. When lasing occurs, the round-trip gain offsets the round-trip losses for the laser cavity 140A. In other words, the gain of the semiconductor gain medium 120A is clamped to the gain value necessary to offset the round-trip losses. The optical signal is amplified 240 according to this gain value as it propagates along the amplifying path 130A (i.e., through the semiconductor gain medium 120A). Steps 220, 230 and 240 are repeated in each SOA stage 110, resulting in a finally amplified optical signal which exits via the output 114N of the last SOA stage 110N.

Note that the gain experienced by the optical signal as it propagates through each SOA stage 110 is determined in part by the gain value of the semiconductor gain medium 120 (it is also determined, for example, by the length of the amplifying path 130) and this gain value, in turn, is determined primarily by the lasing threshold for the laser cavity 140. In particular, the gain experienced by the optical signal as it propagates through each SOA stage 110 is substantially independent of the amplitude of the optical signal. This is in direct contrast to the situation with non-lasing SOAs and overcomes the distortion and crosstalk disadvantages typical of non-lasing SOAs. This assumes, of course, that each SOA stage 110 is operating within its power limits (i.e., that none of the SOA stages 110 has reached its saturable power limit) as will be further discussed below.

Figure 3A:
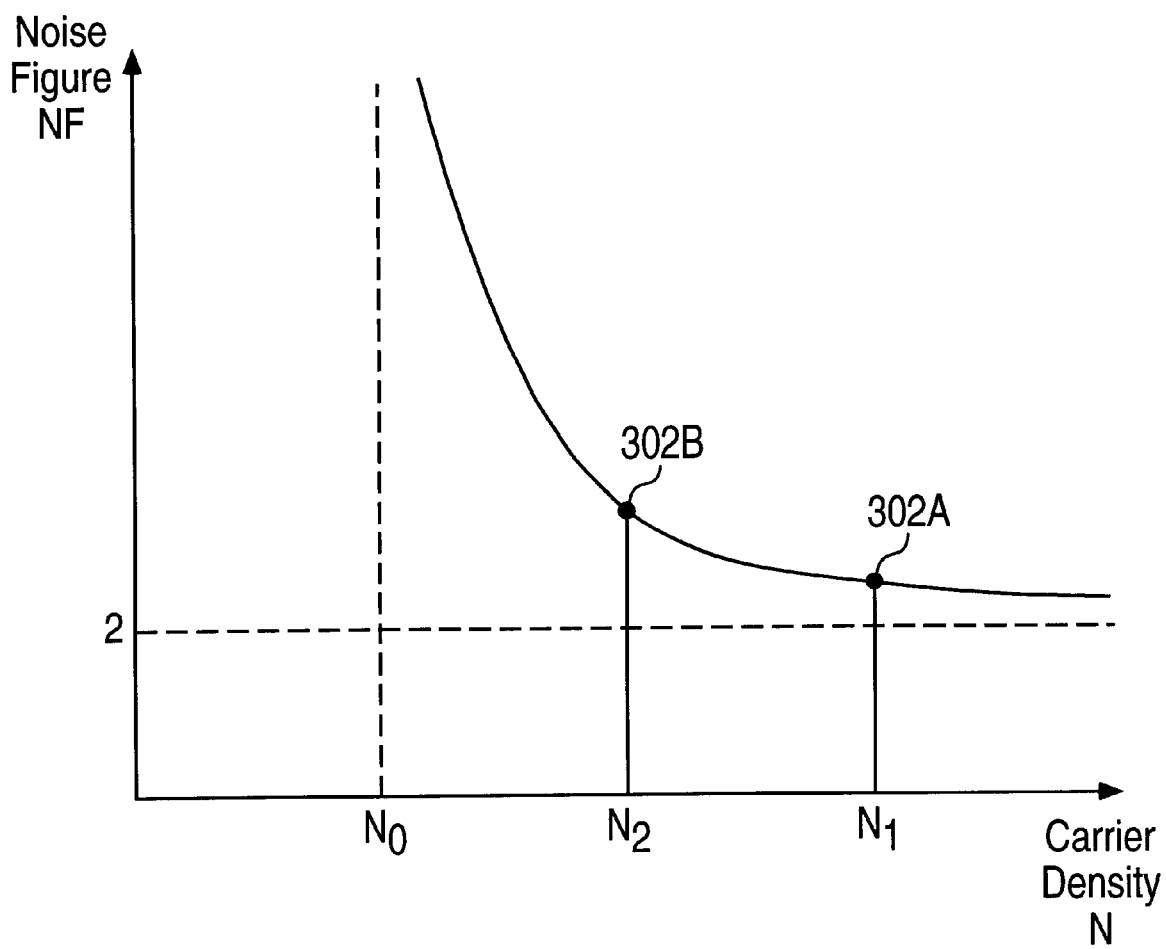
FIG. 3A is a graph of noise figure as a function of carrier density at the lasing threshold for an SOA.
Figure 3B:
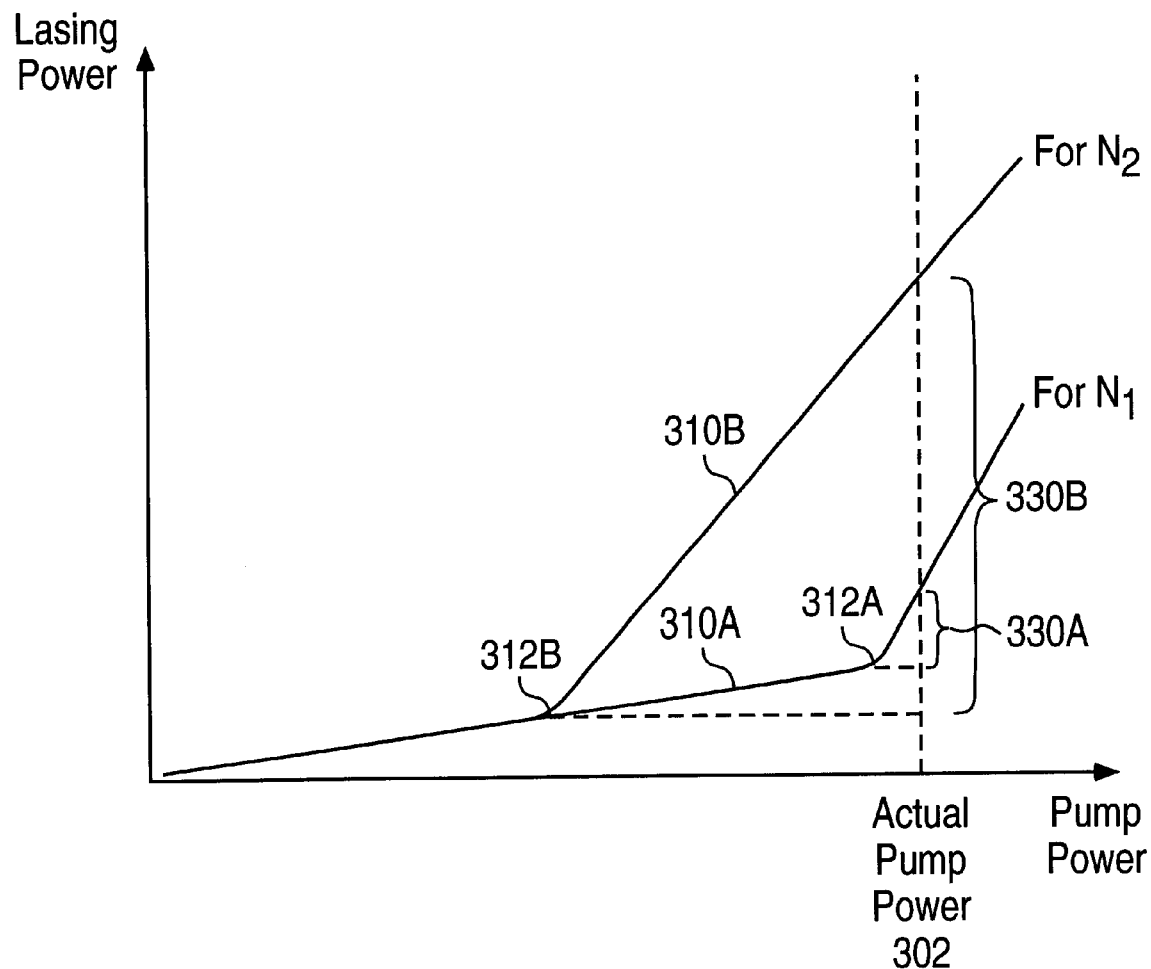
FIG. 3B is a graph of lasing power as a function of pump power.
Figure 3C:
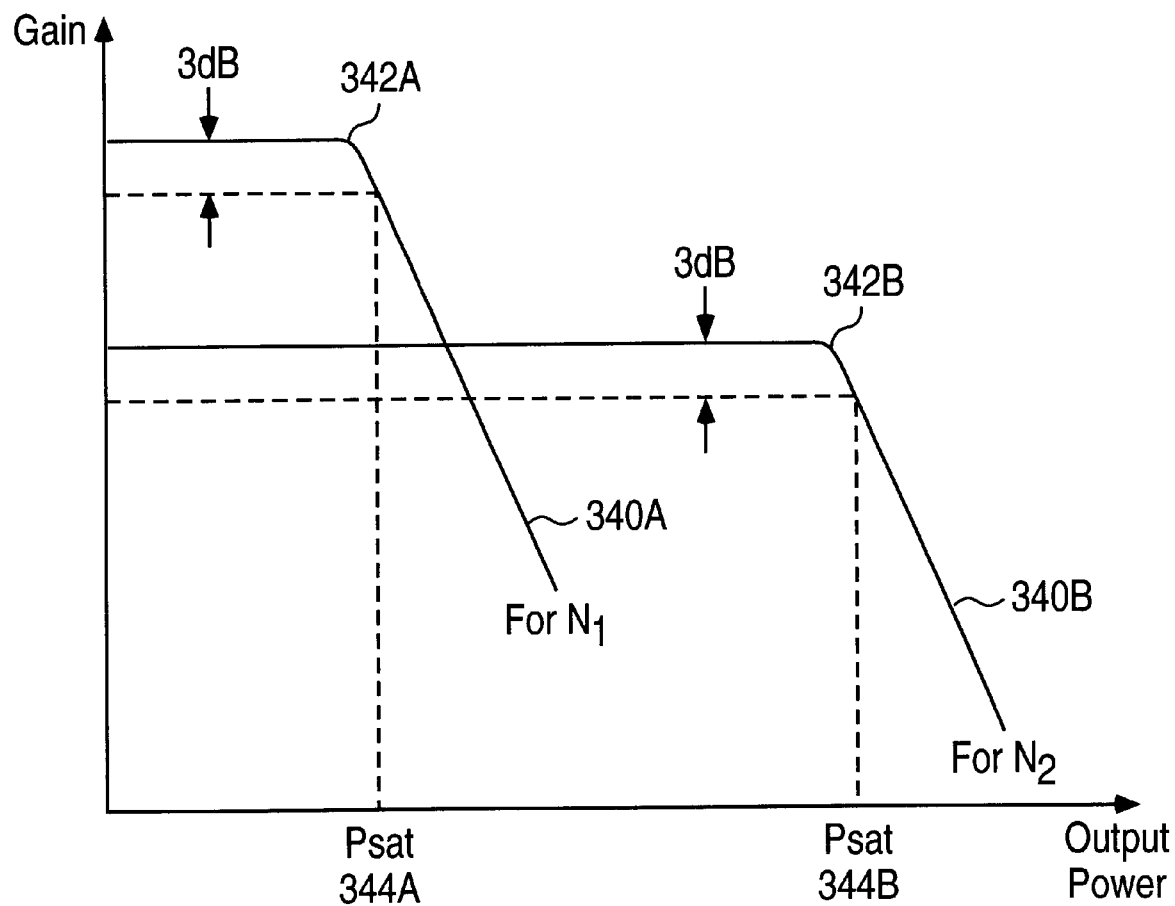
FIG. 3C is a graph of gain as a function of output power.

FIGS. 3A–3C are graphs used to illustrate a preferred embodiment of SOA 100. Referring first to FIG. 3A, this graph shows noise figure (NF) as a function of carrier density at the lasing threshold for the SOA stage (N). NF for an SOA stage 110 is a measure of the noise performance of the stage and is roughly defined as the ratio of the signal-to-noise ratio at the input 112 of the stage to the signal-to-noise ratio at the output 114 of the stage. Noise performance may also be measured using other performance metrics, but for clarity and consistency, NF will be used throughout this disclosure. It should be noted, however, that the invention is not limited to using NF as the noise performance metric. Lower NF indicates better noise performance. N is as follows. During operation of the SOA stage 110, the pump increases the carrier density in the semiconductor gain medium 120, typically by increasing the electron population in the conduction band (e.g., by injecting electrons into the conduction band), increasing the hole population in the valence band, or both. The recombination of carriers results in the emission of radiation which forms the basis for the beam produced by the laser cavity 140. N is the carrier density required to reach the lasing threshold for the laser cavity 140 of SOA stage 110. NF may be approximated by the equation $NF=2N/(N-N_0)$, where N is the carrier density at the lasing threshold and $N_0$ is the carrier density for the transparency energy state for the semiconductor gain medium 120. As shown in FIG. 3A and the previous equation, NF decreases as N increases. In particular, an SOA stage 110 which has a higher value of N (e.g., $N_1$ in FIG. 3A) will have a lower NF 302A and better noise performance. Conversely, an SOA stage 110 with a lower value of N (e.g., $N_2$) will have a higher NF 302B and worse noise performance.

FIG. 3B is a graph depicting lasing power as a function of pump power for carrier densities $N_1$ and $N_2$. The lasing power is the power of the beam produced by the laser cavity 140, which is not necessarily a laser (e.g., if the laser cavity is operating below the lasing threshold). The pump power is the power used to pump the laser cavity 140. The two curves 310A and 310B correspond to higher and lower values of N (i.e., $N_1$ and $N_2$ respectively). In both curves, there is a knee 312 which represents the onset of lasing. To the left of this knee 312, the beam produced by laser cavity 140 is more similar to that produced by an LED. To the right of this knee, the beam is a laser beam. Note that the knee 312A for the $N_1$ case occurs at a higher pump power than the knee 312B for the $N_2$ case. Assuming that the same pump power 320 is used in both cases, which is common since the pump power is usually limited by other factors such as thermal dissipation, this means that the laser power 330A produced in the $N_1$ case is less than the laser power 330B produced in the $N_2$ case.

This, in turn, affects amplification of the optical signal as shown in FIG. 3C, which graphs gain as a function of output power for the $N_1$ and $N_2$ cases. Here, gain is the gain experienced by the optical signal as it propagates through an SOA stage 110. Output power is the power of the amplified signal as it exits the SOA stage 110. Both curves 340A (for $N_1$) and 340B (for $N_2$) are similar in shape: essentially flat out to a shoulder 342 (due to the gain clamping from the onset of lasing) but rolling off rapidly after the shoulder 342. The shoulder 342 represents the power limit for the SOA stage 110. It is the point at which so much power is directed to amplifying the optical signal that lasing begins to be extinguished. Referring again to FIG. 3B, the laser power 330A for the $N_1$ case is less than that 330B for the $N_2$ case and so lasing will be extinguished at a lower output power for the $N_1$, case. As a result, the shoulder 342A for the $N_1$, case occurs at a lower output power than for the $N_2$ case. The saturable power (Psat) is defined as the output power at which the gain has rolled off by 3 dB and is a measure of an output power limit. Analogously to noise performance and NF, the output power limit may be measured using performance metrics other than the saturable power Psat. However, for clarity and consistency, Psat will be used throughout this disclosure but the invention is not limited to using Psat as the metric for output power limit. The saturable power 344A for the $N_1$, case is less than that 344B for the $N_2$ case, meaning that the $N_2$ case can output a higher power amplified optical signal than the $N_1$ case. Note that the saturable power 344 for an SOA stage 110 may be selected by selecting an appropriate value of N. In other words, the saturable power is a design parameter; whereas it typically is not for non-lasing SOAs. This is a significant advantage, as will be seen.

Considering FIGS. 3A–3C together reveals an inherent tradeoff. Good noise performance requires a high N (e.g., $N_1$) but high power output requires a low N (e.g., $N_2$). A single SOA stage cannot achieve both. However, the situation may be improved by a multi-stage SOA 100 as further described below.

Figure 4A:
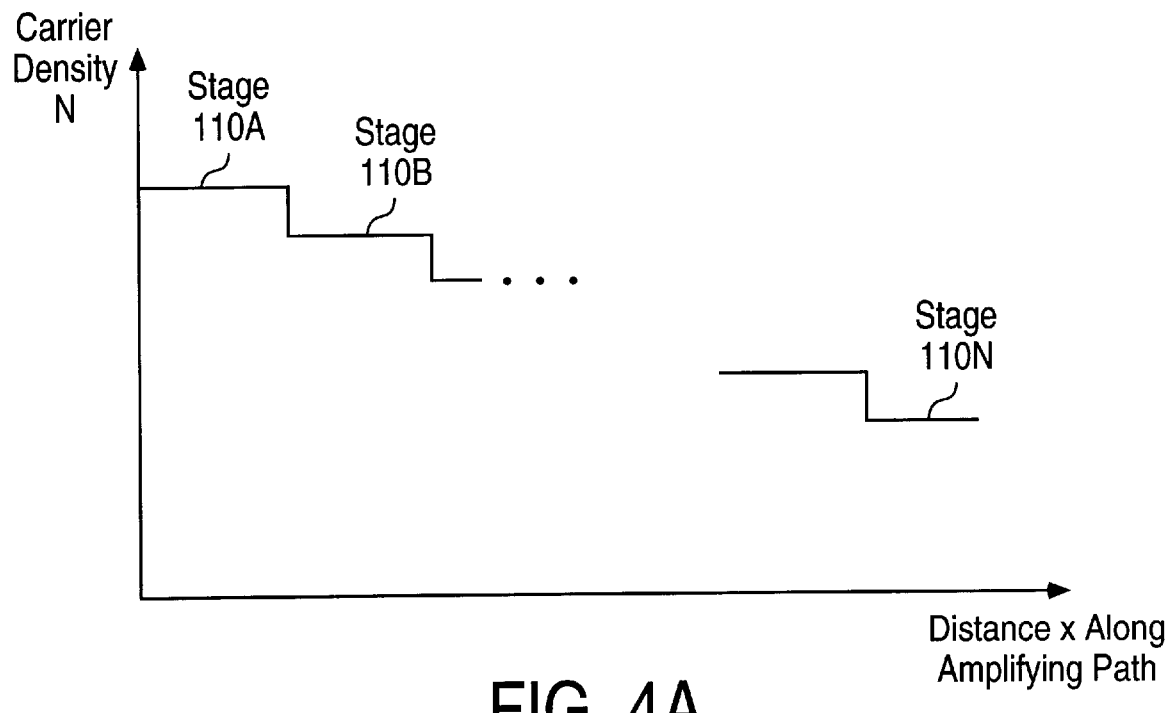
FIG. 4A is a graph of carrier density at the lasing threshold as a function of distance along the amplifying path according to a preferred embodiment of multi-stage SOA 100.
Figure 4B:
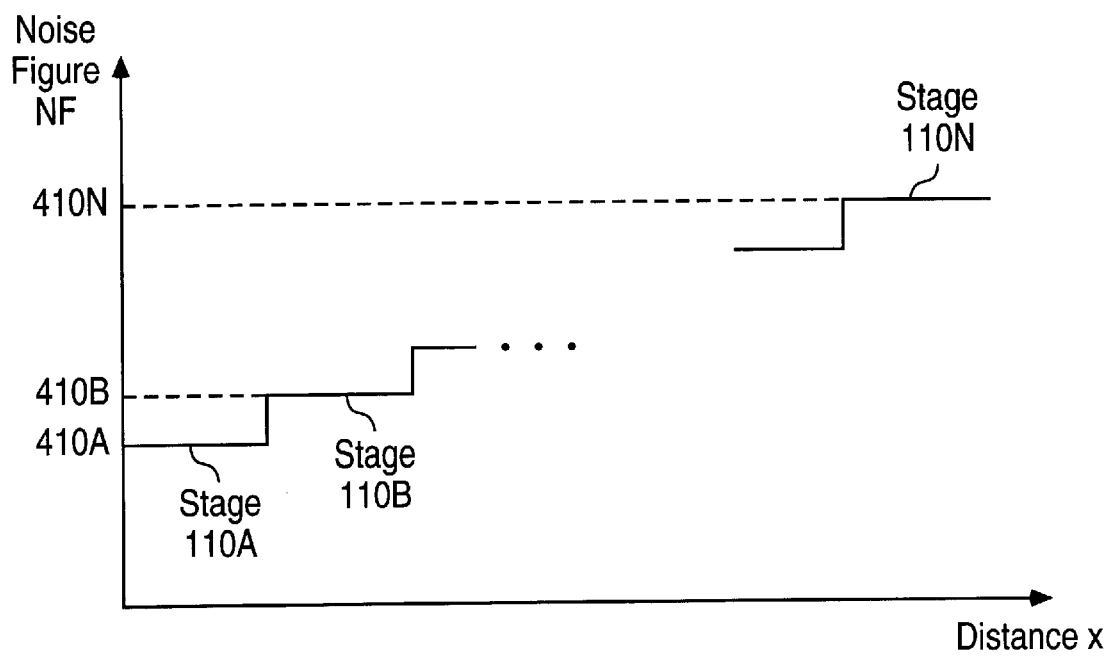
FIG. 4B is a graph of noise figure along the amplifying path for the same preferred embodiment.
Figure 4C:
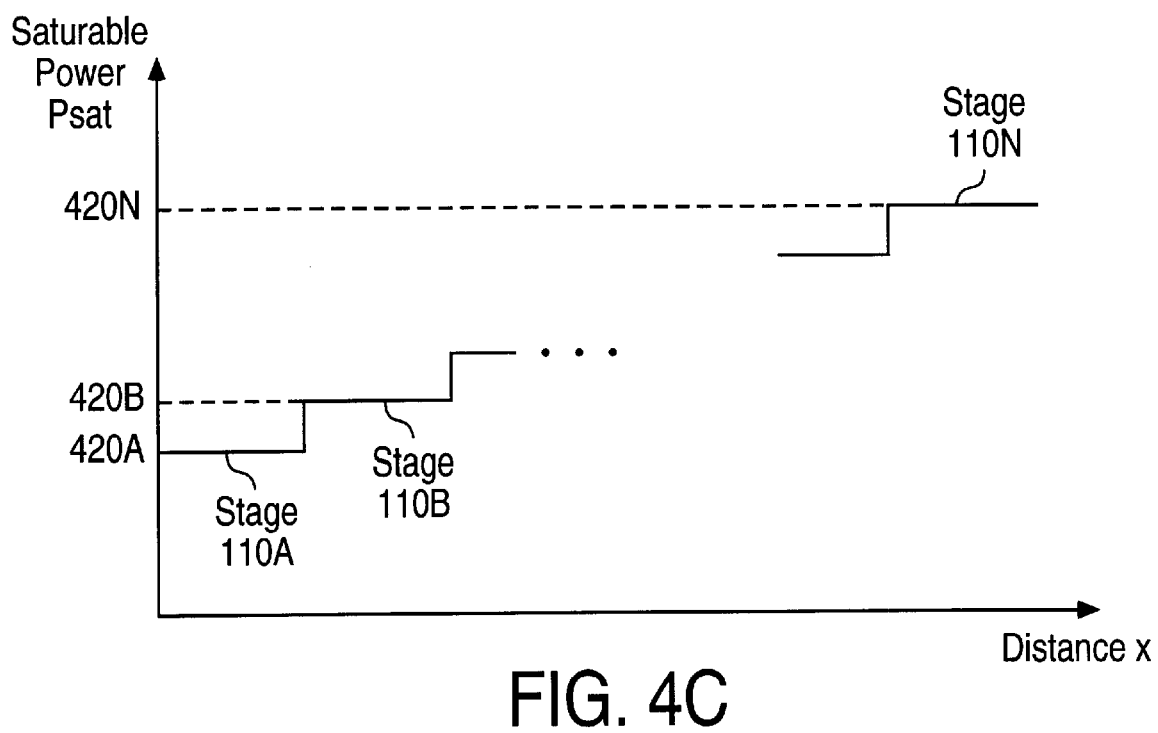
FIG. 4C is a graph of saturable power along the amplifying path for the same preferred embodiment.

FIGS. 4A–4C are graphs illustrating a preferred embodiment of multi-stage SOA 100 which overcomes this inherent tradeoff. In each of these figures, the independent variable x is the distance along the amplifying path through the multi-stage SOA 100. In this embodiment, N is a design parameter of each SOA stage 110 and each stage 110 is designed to have a successively lower value of N as shown in FIG. 4A. As a result, successive SOA stages have increasingly worse noise performance, as shown in FIG. 4B, but increasingly higher saturable power, as shown in FIG. 4C. The first SOA stage 110A has the highest value of N, resulting in the best noise performance 410A but the lowest saturable power 420A. The low saturable power, however, is not detrimental because the first SOA stage 110A is early in the amplification chain so the optical signal output by this stage 110A does not require a high saturable power. Conversely, the good noise performance is a distinct advantage since noise introduced in this early SOA stage 110A will be amplified by later stages 110B–110N. Similarly, the last SOA stage 110N has the lowest N, resulting in the worst noise performance 410N and the highest saturable power 420N. For the last stage 110N, the poor noise performance is less of a concern since there are no subsequent stages to amplify the noise introduced in this stage 110N. The high saturable power, however, is a distinct advantage since the last stage 110N outputs the highest power optical signal.

By comparison, a single stage SOA would require the N of the last stage 110N in order to achieve the same saturable power 420N (or the same overall gain assuming the incoming optical signals were of the same strength) as the multi-stage SOA 100. However, this choice of N would result in the noise FIG. 410N over the entire amplifying path, resulting in worse noise performance. In other words, the preferred embodiment of FIGS. 4A–4C can achieve both good noise performance and high output power compared to the single stage SOA (or a multi-stage SOA in which all the stages are identical).

The design parameter N of the various SOA stages 110 may be selected in a variety of ways. In a preferred approach, the first SOA stage 110A is designed to maximize the value of N in order to optimize the noise performance 410A of this stage. For a given design for the first SOA stage 110A, fixing the value of N also fixes the saturable power 420A, thus determining the maximum power which may be output by the first SOA stage 110A. The amplitude of the incoming signal is typically determined by the application for which the SOA stage 110A is intended. The length of the first SOA stage 110A is selected so that the maximum overall gain can be achieved by the low-noise first SOA stage 110A but ensuring that, after amplification, the incoming signal does not exceed the saturable power for the stage. The carrier density N for the last stage 110N is selected so that the saturable power 420N meets the output power requirement for the overall multi-stage SOA. The low value of N, however, will lead to poor noise performance in this last stage 110N. Therefore, it is desirable to limit the length (and overall gain) of this last stage. Intermediate stages are selected to fill in the gap in the amplification chain between the first stage 110A and last stage 110N.

As a numerical example, consider a multi-stage SOA 100 which is designed for a 30 dB gain (i.e., ×1000 amplification) and a 50 mW output. This means that the incoming optical signal will have a power of 50 $\mu$W or below. The first SOA stage 110A is selected to have a high value of N, say N=3 $N_0$. The value of N is typically limited by considerations such as thermal effects. The resulting noise figure is NF=2 N/(N−$N_0$)=3 and assume that the corresponding saturable power is 1 mW. To stay within the 1 mW saturable power limit for the first SOA stage 110A, the incoming 50 $\mu$W optical signal cannot be amplified by more than ×20. To be conservative, the length of the first SOA stage 110A is selected so that the overall gain is ×10, or 10 dB, resulting in a maximum output power for the first SOA stage 110A of 0.5 mW. For the last SOA stage 110N, assume that a saturable power of 50 mW may be achieved with a value of N=1.3 $N_0$, with a resulting noise figure of approximately NF=9. In order to limit the impact of the poor noise figure, the gain of the last stage 110N is limited to 5 dB, or ×3. The intermediate stage(s) must then amplify a 0.5 mW input into a 17 mW output, for an overall gain of 15 dB or ×30. This may be achieved in multiple stages (e.g., three stages of 5 dB each), but for simplicity assume a single intermediate stage. Further assume that N=1.7 $N_0$ is required to achieve the 17 mW output. The resulting noise figure for this stage would then be approximately NF=5. The overall noise figure for the multi-stage SOA may be approximated by the Friis equation:

$$NF = NF_1 + (NF_2-2)/(G_1) + (NF_3-2)/(G_1*G_2) + \quad (\text{Eqn. 1})$$

where NF is the overall noise figure for the multi-stage SOA, $NF_x$ is the noise figure for stage x (stage 1 being the first stage), and $G_x$, is the gain for stage x. Applying this equation yields NF=3+(5−2)/10+(9−2)/(10*30)=3.5 for the above example. By comparison, a single stage SOA with the same 30 dB gain and 50 mW output power would require N=1.3 $N_0$ for the entire length of the device, resulting in an overall noise figure of NF=9, significantly higher than the multi-stage SOA value of NF=3.5.

The preferred embodiment described above has been described with respect to variations in the carrier density N. However, it will be apparent that these variations can be achieved using a number of other design parameters. For example, N is the carrier density at the lasing threshold. That is, N is the carrier density necessary to achieve the gain required to offset round-trip losses in the laser cavity 140. Hence, if the losses are increased, then the required gain will also increase, resulting in a higher N. Losses may be due to a variety of factors, including the reflectivity of mirrors forming the laser cavity, diffraction losses, losses due to scattering, and absorption losses; and various design parameters may be varied to affect these losses. Alternately, changes in the laser cavity design may also be used to affect N. For example, increasing the round-trip optical path length in the laser cavity, while keeping all losses the same, will decrease N. As a final example, non-lasing SOAs may be appropriate for the early, low-power stages 110 since the power requirements for these early stages may be low enough to avoid the problematic gain saturation effects characteristic of non-lasing SOAs. FIGS. 5–8 illustrate some examples in accordance with the present invention. FIG. 5B shall be discussed in greater detail and depth and generally shows greater detail than the other figures, but it is to be understood that the principles discussed with respect to FIG. 5B also apply to the remaining figures.

Figure 5A:
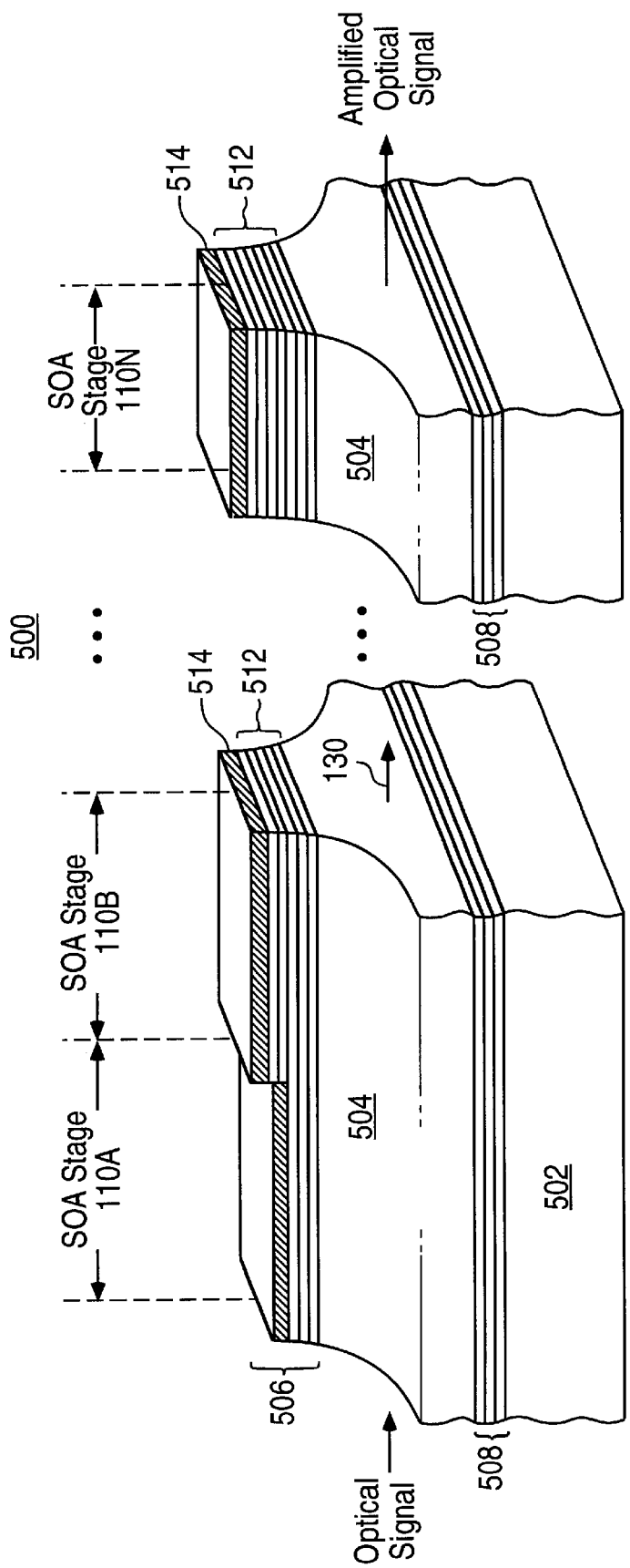
FIG. 5A is a perspective view of a multi-stage, vertically lasing semiconductor optical amplifier (VLSOA) 500 utilizing mirrors of varying reflectivity according to a preferred embodiment of SOA 100.
Figure 5B:
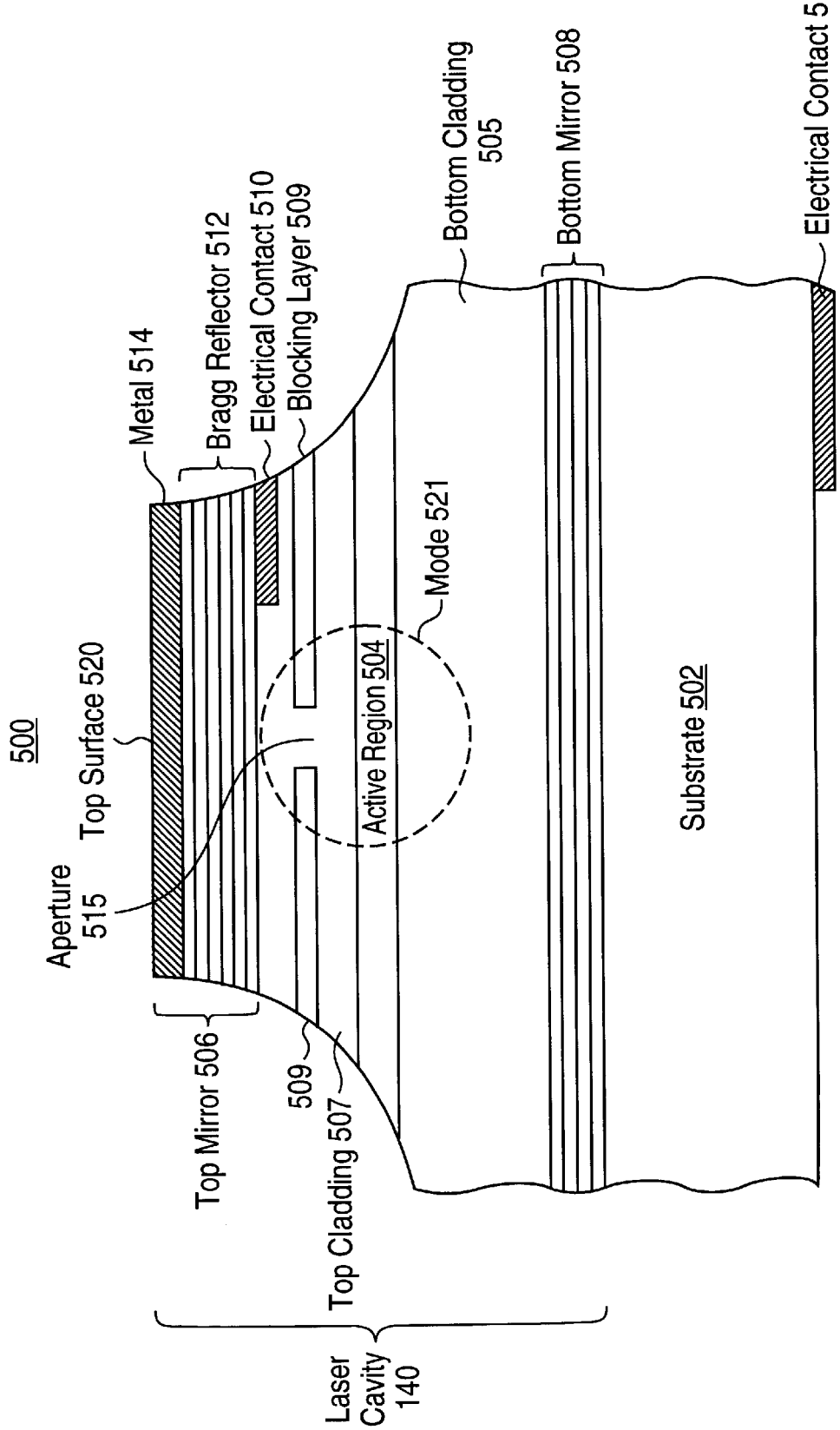
FIG. 5B is a transverse cross-sectional view of VLSOA 500.
Figure 5C:
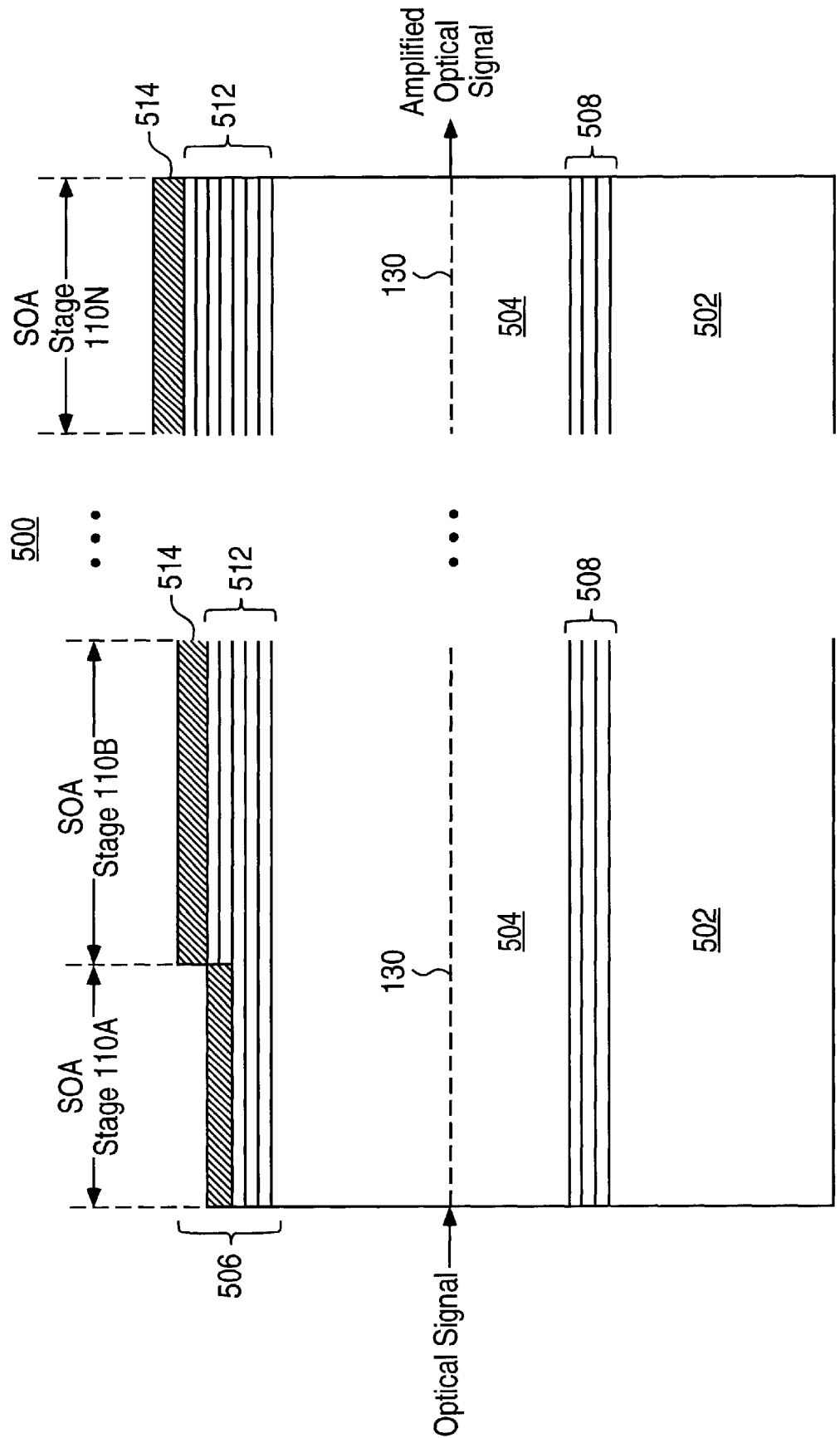
FIG. 5C is a longitudinal cross-sectional view of VLSOA 500.

FIGS. 5A–5C are a perspective view, transverse cross-section, and longitudinal cross-section, respectively, of a preferred embodiment of multi-stage SOA 100, with FIG. 5B showing the most detail. This embodiment is a vertical lasing semiconductor optical amplifier (VLSOA) 500, meaning that the laser cavity 140 is oriented vertically with respect to the amplifying path 130. The VLSOA 500 is long in the longitudinal direction, allowing for a long amplifying path 130 and, therefore, more amplification. The SOA stages 110 are contiguous to each other (see FIG. 5C) and the entire VLSOA 500 is an integral structure formed on a single substrate 502. This allows all of the SOA stages 110 to be fabricated simultaneously using standard semiconductor fabrication techniques, preferably including organo-metallic vapor phase epitaxy (OMVPE) or organometallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

Since the SOA stages 110 are contiguous, the inputs 112 and outputs 114 between stages 110 correspond to the boundaries between the SOA stages 110 but there are no separate physical structures which correspond to these inputs 112 and outputs 114. For example, a single integral semiconductor gain medium 120 (i.e. 504) is used for all SOA stages 110 and each SOA stage 110 simply utilizes a different section of the semiconductor gain medium, as shown in FIG. 5C. The semiconductor gain media for the different SOA stages 110 are not physically separated into distinct pieces in this embodiment.

Referring to FIG. 5B and working away from the substrate 502, each SOA stage within VLSOA 500 includes a bottom mirror 508, bottom cladding 505, an active region 504, top cladding 507, blocking layer 509 (which forms aperture 515), electrical contact 510, and a top mirror 506. In addition, a second electrical contact 511 is formed on the reverse side of substrate 502. Comparing to FIG. 1, the semiconductor gain medium 120 includes the active region 504 and the laser cavity 140 is formed primarily by the two mirrors 506 and 508 and the active region 504. This embodiment is electrically pumped so the pump input 150 includes the electrical contacts 510,511. The optical signal amplified by the VLSOA 500 is confined in the vertical direction by index differences between bottom cladding 505, active region 504, and top cladding 507; and is confined in the transverse direction by index differences between the blocking layer 509 and the resulting aperture 515. As a result, the optical signal to be amplified is generally concentrated in dashed region 521, and the amplifying path 130 is through the active region 504 in the direction out of the plane of the paper with respect to FIG. 5B.

The active region 504 may comprise a multiple quantum well (MQW) active region. MQW structures include several quantum wells and quantum wells have the advantage of enabling the formation of lasers with relatively low threshold currents. Quantum wells may be fabricated using various materials systems, including for example InAlGaAs on InP substrates, InGaAsP on InP, GaInNAs on GaAs, InGaAs on ternary substrates, and GaAsSb on GaAs. A preferred embodiment uses InAlGaAs grown on an InP substrate. GaAs, InGaAs, or InAlGaAs on GaAs; or nitride material systems may also be suitable. Alternatively, the active region 504 may comprise a single quantum well or a double-heterostructure active region. The choice of materials system will depend in part on the wavelength of the optical signal to be amplified, which in turn will depend on the application. Wavelengths in the approximately 1.5–1.6 micron, 1.28–1.35 micron, and 1.4–1.5 micron regions are currently preferred for telecommunications applications. The 1.28–1.35 micron region is currently also preferred for data communications over single mode fiber, with the approximately 0.8–1.1 micron region being an alternate wavelength region.

The mirrors 506 and 508 may comprise Bragg reflectors or other types of mirrors and typically have reflectivies in the range of approximately 95–100%. Bragg reflectors are formed by periodic variations of the index of refraction of a medium and can be highly reflective. For example, the Bragg reflector may comprise alternating layers of thicknesses $d_1$ and $d_2$ and refractive indices $n_1$ and $n_2$ such that $n_1 d_1 + n_2 d_2 = \lambda/2$, where $\lambda$ is the wavelength to be reflected. The reflectivity $R = \{[1-(n_1/n_2)^{2N}]/(1+(n_1/n_2)^{2N})\}^2$, where N is the number of periods (pairs) in the Bragg reflector. Reflectivities as high as 99% or more may be achieved. Bragg reflectors may be fabricated using various materials systems, such as, for example, alternating layers of GaAs and AlAs, or alternating layers of $SiO_2$ and $TiO_2$. In a preferred embodiment, mirror 508 is a Bragg reflector formed by either alternating layers of InAlGaAs and InAlAs, or alternating layers of GaAs and AlGaAs; and mirror 506 is a hybrid mirror, which combines a number of layers of a Bragg reflector 512 (specifically, alternating layers of Si and $SiO_2$) followed by a metallic mirror 514 (specifically, gold). Blocking layer 509 is a lower index of refraction than aperture 515. Hence, the effective cross-sectional size of laser cavity 140 is determined in part by aperture 515.

The electrical contacts 510,511 are metals that form an ohmic contact with the semiconductor material. Commonly used metals include titanium, platinum, nickel, germanium, gold, and aluminum. In this embodiment, the laser cavity is electrically pumped by injecting a pump current via the electrical contacts 510,511 into the active region 504. In particular, contact 510 is a p-type contact to inject holes into active region 504, and contact 511 is an n-type contact to inject electrons into active region 504. Blocking layer 509 is current blocking, thus channeling the pump current through aperture 515. This increases the spatial overlap with optical signal 521. Each SOA stage 110 has a separate electrical contact 510 and so may be independently pumped and, in fact, each SOA stage 110 preferably has a number of isolated electrical contacts 510 to allow for independent pumping within the stage. This is advantageous because in this embodiment, each SOA stage 110 is long in the longitudinal direction and independent pumping allows, for example, different voltages to be maintained at different points along the SOA stage. For example, later stages 110 may require higher pump powers in order to achieve higher output powers; earlier stages may require higher current densities in order to achieve higher carrier densities. Alternately, the contacts 510 may be doped to have a finite resistance or may be separated by finite resistances, rather than electrically isolated. In alternate embodiments, the SOA stages 110 may be optically pumped, in which case the electrical contacts 510,511 would be replaced by optical inputs (which could be as simple as facets of the active region 504).

The SOA stages 110 differ in that the round-trip reflectivities of the top and bottom mirrors 506 and 508 differ from stage to stage. In particular, the mirrors 506,508 of the first SOA stage 110A have the lowest round-trip reflectivity and the mirrors 506,508 of each subsequent SOA stage 110 have an increasingly higher round-trip reflectivity. In the previously described embodiment which uses hybrid Bragg/metal mirrors 506, the number of layers in the Bragg portion of the top mirror 506 increases from stage 110A to stage 110N, thus increasing the reflectivity of the top mirror 506. As the mirror reflectivities increase from stage to stage, this means that the round-trip losses for the laser cavities 140 decrease from stage to stage. This, in turn, means that the round-trip gain required to reach the lasing threshold decreases from stage to stage and that the carrier density N at the lasing threshold also decreases from stage to stage. This is precisely the situation depicted in FIGS. 4A–4C and VLSOA 500 functions as described with respect to FIGS. 4A–4C.

More specifically, referring again to FIG. 2, each SOA stage 110 of VLSOA 500 operates as follows. The active region 504 is pumped 230 so that the carrier density in the semiconductor gain material 120 increases. The pumping is performed at a sufficiently high level such that a lasing threshold of a mode of the vertical cavity 140 is exceeded and laser radiation is generated by the vertical cavity 140. This laser radiation may be emitted from the vertical cavity, for example, through the top surface 520 or into the substrate 502 or it may be generated but not actually emitted from the stage 110. The laser radiation may lie in the visible light range, infrared range, ultraviolet range, or any other frequency range.

While the laser cavity 140 is operating above the lasing threshold, an optical signal received from the previous SOA stage 110 propagates 220 along the amplifying path 130 for the current SOA stage 110. As the optical signal propagates 220 through the active region 504, the optical signal is amplified 240 by a gain multiplier due to stimulated emission of additional photons. The gain multiplier is substantially constant (i.e., independent of the amplitude of the optical signal) because the laser radiation produced by laser cavity 140 acts as a ballast to prevent gain saturation. When the optical signal is weaker, less additional photons are stimulated by the optical signal, but more laser radiation is generated. When the optical signal is stronger, more additional photons are stimulated by the optical signal, but less laser radiation is generated. Typically, the value of the constant gain multiplier is inversely proportional to the loss of the cavity mirrors 506 and 508. For example, if a 0.2% loss (99.8% reflectivity) results in a gain of 10 dB (10 times), then a three times larger 0.6% loss (99.4% reflectivity) would result in a three times larger logarithmic gain of 30 dB (1000 times) for otherwise identical stages 110.

Figure 6:
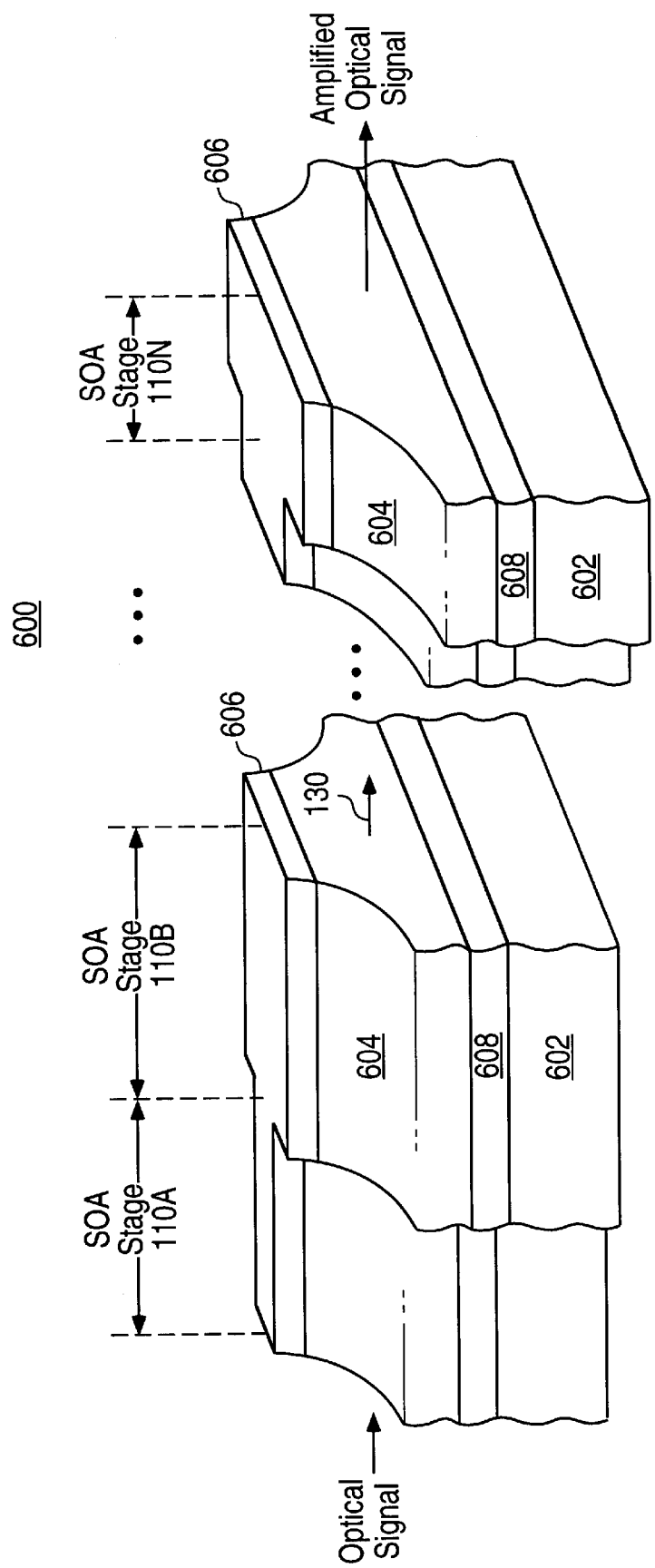
FIG. 6 is a perspective view of a multi-stage VLSOA 600 of varying width according to another embodiment of SOA 100.

FIG. 6 is a perspective view of a multi-stage VLSOA 600 of varying width according to another embodiment of SOA 100. VLSOA 600 is similar to VLSOA 500 with components 602–608 corresponding to components 502–508 of VLSOA 500, but with the following differences. First, the reflectivities of the mirrors 506,508 of VLSOA 500 varied from stage to stage; whereas they do not in VLSOA 600. Second, the width of each SOA stage 110 of VLSOA 500 was constant; whereas each SOA stage 110 of VLSOA 600 becomes progressively wider. In particular, the first SOA stage 110A (and the effective cross-section of laser cavity 140A) is the narrowest while the effective cross-section of the laser cavity 140 of each subsequent SOA stage 110 is increasingly wider. This means that the round-trip diffraction losses for the laser cavities 140 decrease from stage to stage. This, in turn, means that the round-trip gain required to reach the lasing threshold decreases from stage to stage and that the carrier density N during lasing also decreases from stage to stage. This is again the situation depicted in FIGS. 4A–4C and VLSOA 600 functions as described with respect to FIGS. 4A–4C. As explained previously, the later stages 110 of VLSOA 600 are able to support higher output powers because the saturable power increases with the decreasing carrier density N. The increasing width also results in higher output powers because later stages are simply larger in cross-sectional area. In an alternate embodiment, the physical width of each SOA stage 110 is constant from stage to stage, but the size of aperture 515 increases from stage to stage, thus increasing the effective cross-section of each laser cavity 140.

FIGS. 5 and 6 depict two embodiments in accordance with the preferred embodiment of FIGS. 4A–4C. Other embodiments will be apparent. For example, any approaches for varying the round-trip losses in the laser cavity 140 will also result in variations of the carrier density N at the lasing threshold and, therefore, can be used to implement the preferred embodiment of FIGS. 4A–4C. U.S. Pat. No. 6,445,495, "Tunable-gain Lasing Semiconductor Optical Amplifier," discloses a number of such approaches. For example, referring again to FIG. 5B, the reflectivity of either top mirror 506 or bottom mirror 508 may be adjusted by ion implantation, by temperature adjustment, by an applied voltage, by mechanical deformation of the mirror, by tilting the mirror, by horizontally displacing the mirror, or by some other mechanism. As another example, an absorptive layer, such as a liquid crystal layer, may be introduced into the laser cavity 140, with the absorption varying from stage to stage; or ion implantation may be used to adjust the absorption or scattering within the laser cavity 140. Alternately, aperture 515 may be moved in the vertical direction to vary the amount of aperturing or scattering introduced. For example, if aperture 515 is located at a null of the dominant mode for laser cavity 140, its effect will be minimized, whereas placing aperture 515 at an anti-null will maximize its effect. These techniques may also be used in combination. Furthermore, the adjustment mechanism may be dynamically adjustable, thus allowing for real-time adjustment of SOA 100.

Figure 7:
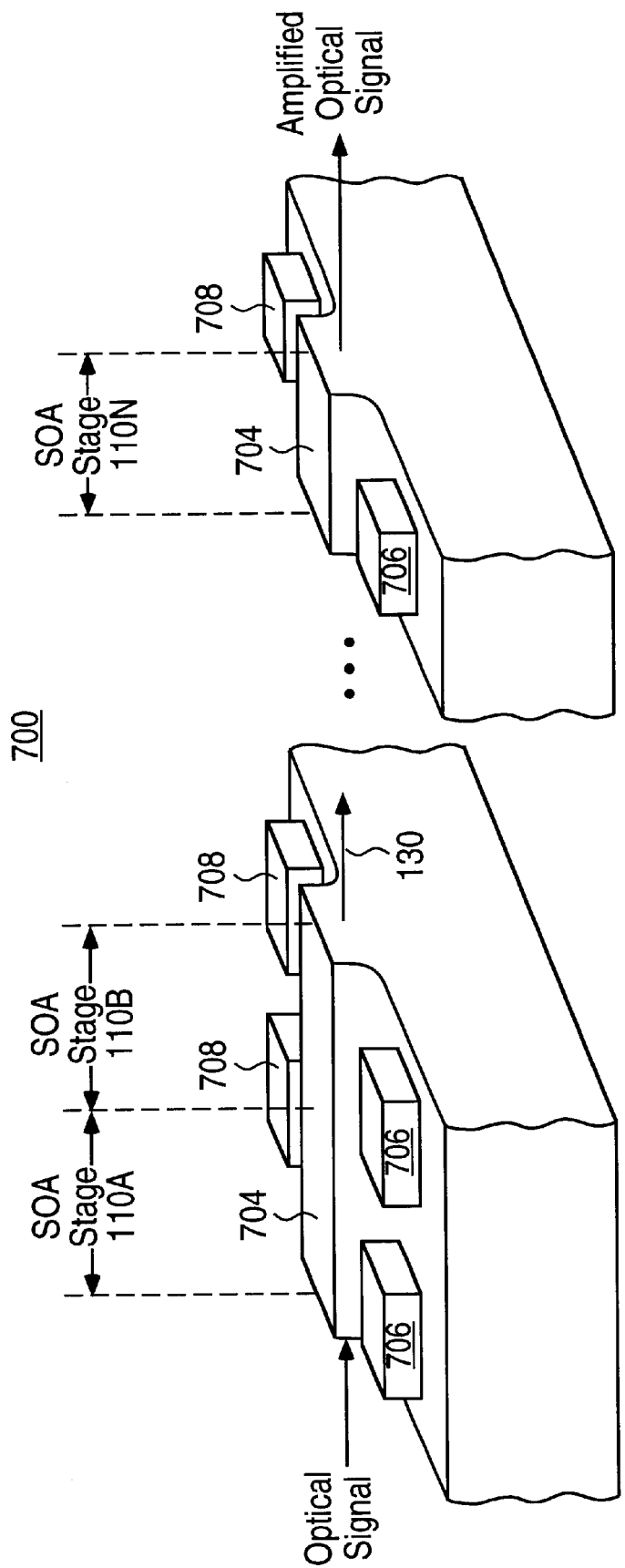
FIG. 7 is a perspective view of a multi-stage transverse lasing semiconductor optical amplifier (TLSOA) 700 according to an embodiment of SOA 100.

FIG. 7 is a perspective view of a multi-stage transverse lasing semiconductor optical amplifier (TLSOA) according to an embodiment of SOA 100. In the multi-stage TLSOA 700, each SOA stage 110 includes a laser cavity 140 oriented transversely with respect to the amplifying path 130. The laser cavity 140 includes an active region 704 disposed between a right cavity mirror 706 and a left cavity mirror 708. The active region 704 is pumped such that a lasing threshold of the transverse cavity 140 is surpassed. As a result, the laser cavity 140 generates laser radiation and clamps the gain of the active region 704 to a value which is essentially constant. The optical signal propagating along the amplifying path 130 is amplified as its passes through the active region 704.

The SOA stages 110 of TLSOA 700 differ in that the mirror reflectivities increase from stage 110A to stage 110N. As a result, the carrier density N at the lasing threshold decreases from stage 110A to stage 110N, which is the situation depicted in FIGS. 4A–4C and TLSOA 700 functions as described with respect to FIGS. 4A–4C. The multi-stage TLSOA 700 in FIG. 7 is analogous to the multi-stage VLSOA 500 in FIG. 5, and the previous description of alternate embodiments for VLSOA 500 (and 600) also applies to TLSOA 700.

Figure 8:
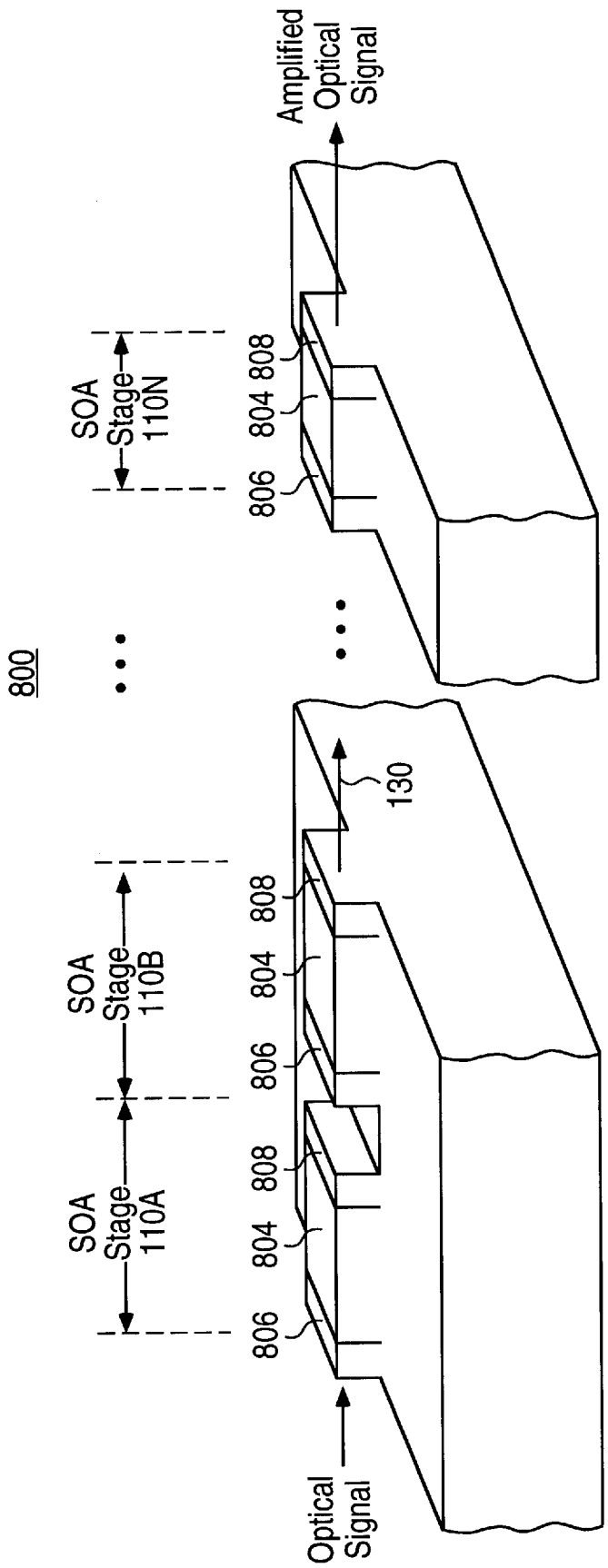
FIG. 8 is a perspective view of a multi-stage longitudinally lasing semiconductor optical amplifier (LLSOA) 800 according to an embodiment of SOA 100.

FIG. 8 is a perspective view of a multi-stage longitudinally lasing semiconductor optical amplifier (LLSOA) 800 according to an embodiment of SOA 100. In the multi-stage LLSOA 800, each SOA stage 110 includes a laser cavity 140 oriented longitudinally with respect to the amplifying path 130. In other words, unlike the VLSOA and TLSOA designs, the laser cavity in LLSOA 800 is not off-axis with respect to the amplifying path. Rather, the laser cavity is aligned with the amplifying path 130. The laser cavity 140 includes an active region 804 disposed between a first cavity mirror 806 and a second cavity mirror 808. The active region 804 is pumped such that a lasing threshold of the longitudinal cavity 140 is surpassed. As a result, the laser cavity 140 generates laser radiation and clamps the gain of the active region 804 to a value which is essentially constant. The optical signal propagating along the amplifying path 130 is amplified as its passes through the active region 804.

As with VLSOA 500 and TLSOA 700, the SOA stages 110 of LLSOA 800 differ in that the mirror reflectivities increase from stage 110A to stage 110N and LLSOA 800 functions as described with respect to FIGS. 4A–4C. The mirror reflectivities for LLSOA 800, however, are typically much lower than those for VLSOA 500 and TLSOA 700 due to the longitudinal design. Values of 1–20% reflectivity are typical for LLSOA 800, as compared to 95–100% for VLSOA 500 and TLSOA 700. In addition, the mirrors 806,808 for LLSOA 800 typically must be more wavelength selective so that, for example, the optical signal to be amplified is not reflected by the mirrors 806,808 and so only makes a single pass through LLSOA 800. Again, alternate embodiments will be apparent, as discussed previously with respect to for VLSOAs 500 and 600 and TLSOA 700 and also as disclosed in co-pending U.S. patent application Ser. No. 09/273,813, "Tunable-gain Lasing Semiconductor Optical Amplifier."

As another alternative to the embodiments shown in FIGS. 1–8, the various SOA stages 110 may be optically isolated from each other in order to prevent propagation of signals, including amplified spontaneous emission, in the reverse direction (i.e., from stage 110N to 110A). For example, without such isolators, signals generated in any SOA stage 110 may propagate backwards to earlier SOA stages 110, being amplified along the way. When the amplified signal reaches the earlier SOA stage 110, which is designed for lower power in the preferred embodiment of FIG. 4, the unwanted signal may exceed the saturable power limit for that stage and thus prevent the stage from operating correctly. Even if it does not exceed the saturable power limit, the unwanted signal will degrade the performance of the earlier stage 110 since some of the output power budget for that stage will be used by the unwanted signal rather than directed toward amplifying the desired signal. Optical isolators which prevent or reduce this backwards propagation will alleviate this problem. For example, each SOA stage 110 may be implemented on a separate chip, with bulk isolators inserted between the chips. Alternately, the isolators may be integrated with the SOA stages 110 or the SOA stages 110 themselves may be designed to minimize this effect.

Figure 9:
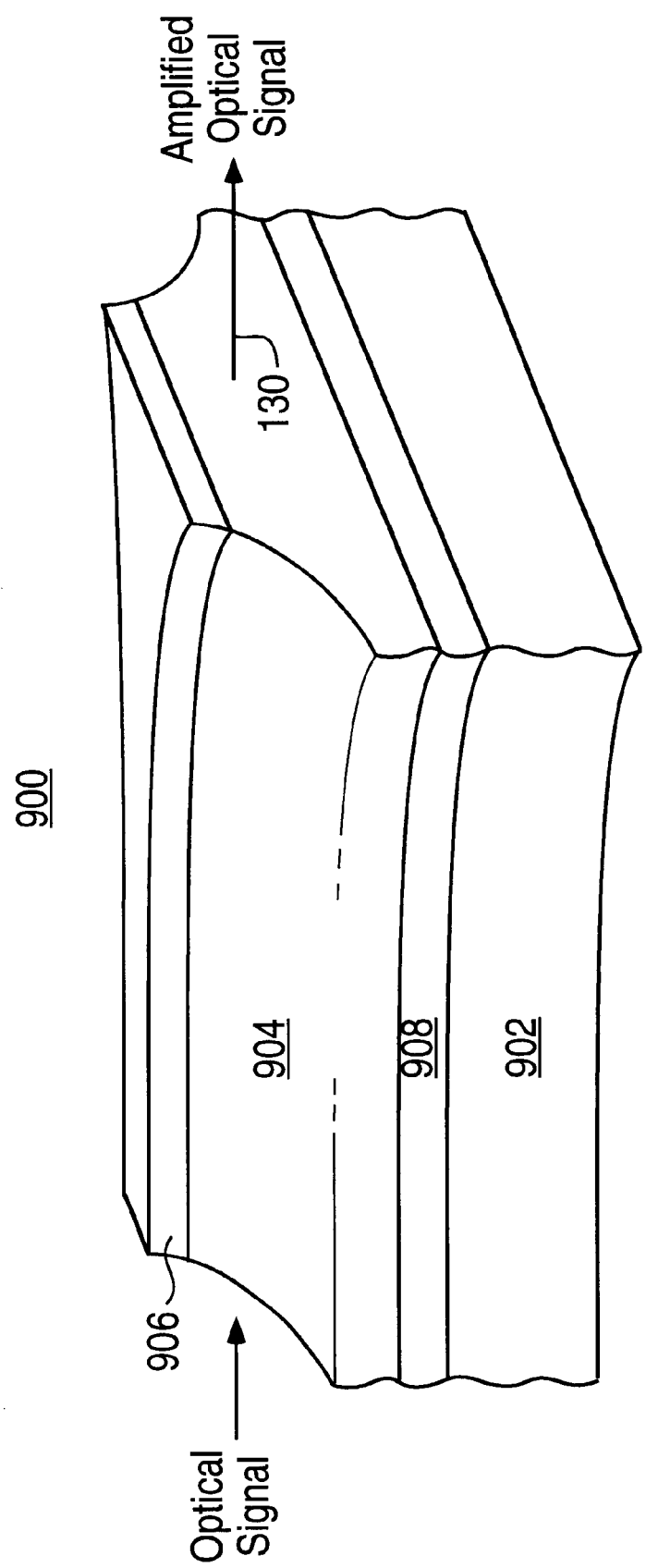
FIG. 9 is a perspective view of a continuously flared VLSOA 900 in accordance with the present invention.

FIGS. 1–8 describe SOAs which consist of a number of discrete stages, with a design parameter varying from stage to stage. In alternate embodiments, the design parameter or the laser cavity varies continuously along the amplifying path rather than discretely in stages. For example, FIG. 9 is a perspective view of a continuously flared VLSOA 900 in accordance with the present invention. This is a variation of multi-stage VLSOA 600, with components 902–908 of VLSOA 900 corresponding to components 602–608 of VLSOA 600. However, rather than having separates SOA stages 110, each of which becomes progressively wider as in VLSOA 600, VLSOA 900 gradually becomes wider as the optical signal propagates from input to output. Alternately, VLSOA 900 may be thought of as a version of VLSOA 600 in which there are an infinite number of infinitesimally thin SOA stages 110. Each point along the amplifying path 130 may then be characterized by the design parameter, which varies along the amplifying path. For example, the increasing width of VLSOA 900 means that the diffraction loss decreases, the carrier density N decreases, the noise figure increases, and the saturable power increases along the amplifying path 130. In addition, the gradual increase in width typically is advantageous for changing the width of a single mode optical signal. The taper typically is less likely to excite secondary modes or to result in unwanted intensity fluctuations (e.g., filamentation). In contrast, the multi-stage design 600 is more likely to excite secondary modes due to the abrupt changes in width and increased scattering at these boundaries. The tapering also favors forward propagation over backward propagation, thus providing a limited amount of isolation in the backward direction. This concept of continuous variation along the amplifying path, rather than discretely in stages, may also be applied to the other SOAs described above.

Figure 10A:
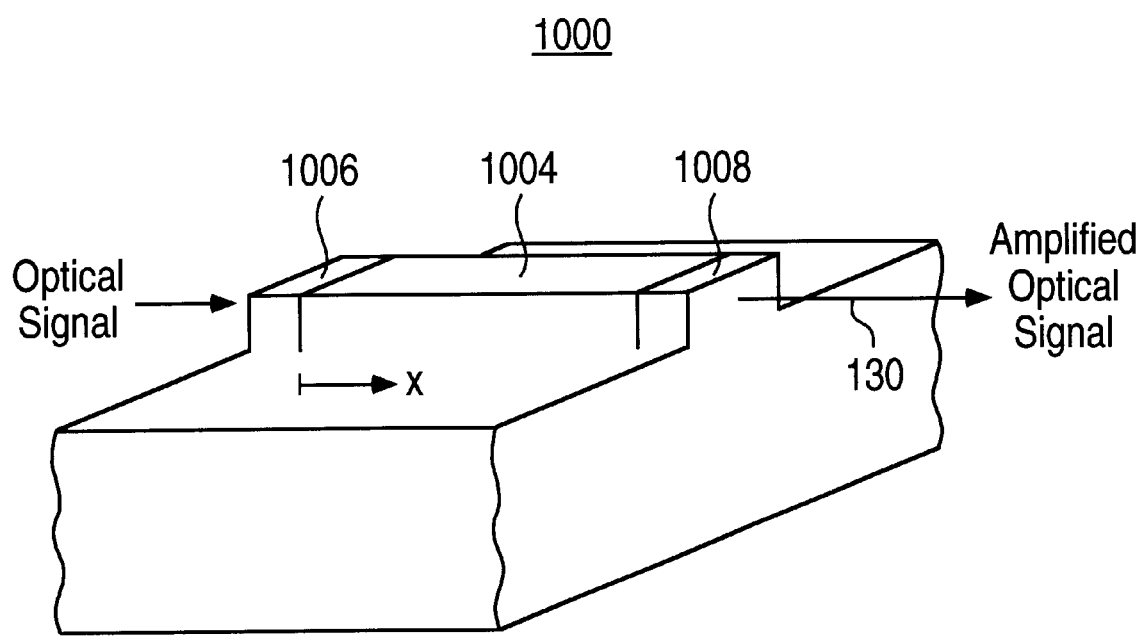
FIG. 10A is a perspective view of an asymmetric longitudinally lasing semiconductor optical amplifier (LLSOA) 1000 in accordance with the present invention.

FIG. 10A is a perspective view of another continuously varying SOA. Here, a longitudinally lasing semiconductor optical amplifier (LLSOA) 1000 includes a laser cavity 140 oriented longitudinally with respect to the amplifying path 130. The laser cavity 140 includes an active region 1004 disposed between first and second cavity mirrors 1006 and 1008, which preferably are wavelength selective like the mirrors 806,808 for LLSOA 800. The active region 1004 is pumped such that a lasing threshold of the longitudinal cavity 140 is surpassed. The optical signal propagating along the amplifying path 130 is amplified as its passes through the active region 1004. In this particular embodiment, however, the reflectivity of mirror 1006 is greater than that of mirror 1008. For example, if a round trip reflectivity of 0.36% were required, rather than having two mirrors each with a reflectivity of 6%, LLSOA 1000 might have a first mirror 1006 with a reflectivity of 18% and a second mirror 1008 with a reflectivity of 2%.

Figure 10B:
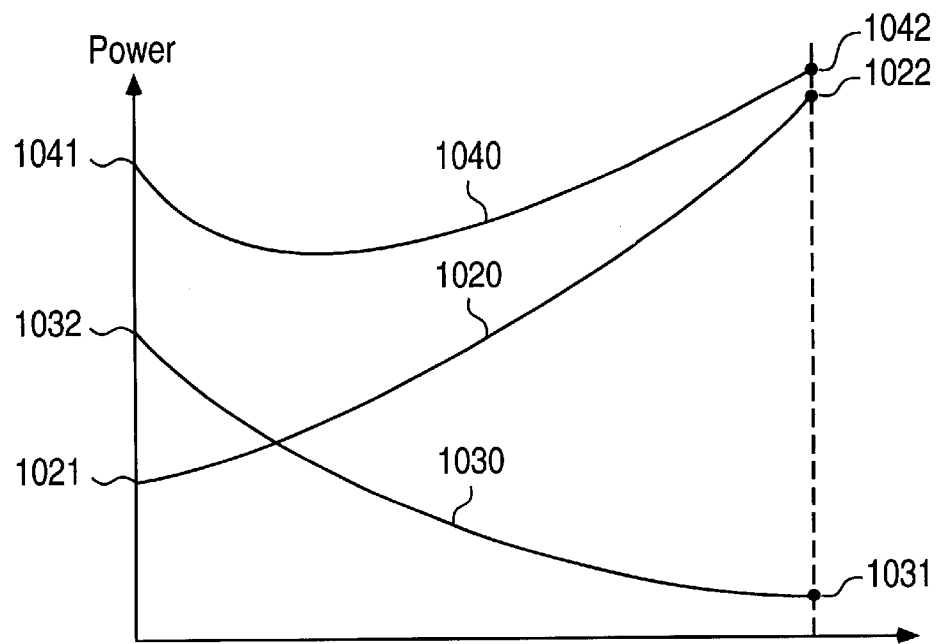
FIG. 10B is a graph of internal laser power as a function of distance along the amplifying path for LLSOA 1000.

FIG. 10B is a graph of internal laser power as a function of distance along the amplifying path for LLSOA 1000. Curve 1020 shows the power of the optical field propagating in the forward direction (i.e., from mirror 1006 to mirror 1008), curve 1030 shows the power of the field propagating in the reverse direction, and curve 1040 shows the sum of the two fields which is the total power of the lasing mode. Beginning with point 1021 on curve 1020, the field propagates in the forward direction and is amplified to reach a strength of 1022 at the end of laser cavity 140. In this embodiment, 2% of this is reflected by mirror 1008 (i.e., point 1031 is 2% of point 1022) and the reflected wave propagates backwards building to a strength of 1032. At mirror 1006, 18% of this is reflected to yield point 1021. Curve 1040 is the sum of curves 1020 and 1030. Due to the asymmetry in the reflectivities of mirrors 1006 and 1008, curve 1040 is also asymmetric with a higher power 1042 at the output of LLSOA 1000 and a lower power 1041 at the input.

Figure 10C:
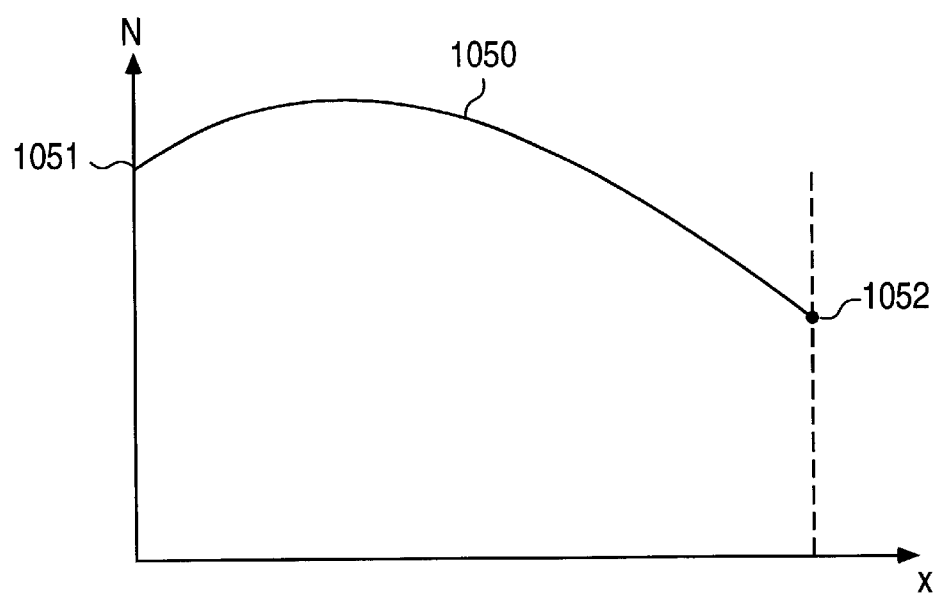
FIG. 10C is a graph of carrier density as a function of distance along the amplifying path for LLSOA 1000.

FIG. 10C is a graph of carrier density N as a function of distance along the amplifying path for LLSOA 1000. N is inversely related to the power 1040. As power 1040 increases, N decreases so that, for example, N 1051 at the input of LLSOA 1000 is higher than N 1052 at the output because the power 1041 at the input is lower than the power 1042 at the output. The carrier density N in FIG. 10C is similar to that in FIG. 4A in that N generally decreases along the amplifying path 130. Of course, in FIG. 4A the decrease occurs over several stages whereas it occurs within a single SOA 1000 in FIG. 10C. The net effect, however, is similar. In particular, for the same reasons given in connection with FIG. 4, LLSOA 1000 will have better noise performance and higher output powers than, for example, an LLSOA in which mirrors 1006,1008 have the same reflectivity. More specifically, if mirrors 1006,1008 had the same reflectivity, then N 1051 and N 1052 would have the same value with N reaching a maximum value in the middle of the laser cavity. The low N 1051 at the input means that this portion of LLSOA 1000 will have poor noise performance, which is especially detrimental since noise introduced in this early portion will be amplified as it propagates through LLSOA 1000. Again, alternate embodiments will be apparent, as discussed with respect to the previous embodiments.

The above description is included to illustrate the operation of the various embodiments of the present invention and is not meant to limit the scope of the invention. From the above description, many variations will be apparent to one skilled in the art that would yet be encompassed by the spirit and scope of the invention. For example, the principles described above may also be applied to rare-earth waveguide amplifiers, including those based on erbium, praseodymium, neodymium, and thulium. The scope of the invention is to be limited only by the following claims.

What is claimed is:

1. A varying lasing semiconductor optical amplifier (SOA) device for amplifying an optical signal, the device comprising:
   an input for receiving the optical signal;
   an output for transmitting an amplified version of the optical signal;
   a semiconductor gain medium having an amplifying path coupled between the input and the output for amplifying the optical signal propagating along the amplifying path;
   a laser cavity including the semiconductor gain medium;
   a pump input coupled to the semiconductor gain medium for receiving a pump to pump the semiconductor gain medium above a lasing threshold for the laser cavity, whereby a gain of the semiconductor gain medium is clamped to a gain value which is substantially independent of an amplitude of the optical signal propagating along the amplifying path; and
   wherein each point along the amplifying path is characterized by a design parameter which varies along the amplifying path.

2. The device of claim 1 wherein the laser cavity is off-axis with respect to the amplifying path.

3. The device of claim 2 wherein
   the design parameter includes a noise figure; and
   the noise figure increases along the amplifying path.

4. The device of claim 2 wherein:
   the design parameter includes a carrier density at a lasing threshold; and
   the carrier density at the lasing threshold decreases along the amplifying path.

5. The device of claim 2 wherein:
   the design parameter includes a saturable power; and
   the saturable power increases along the amplifying path.

6. The device of claim 2 wherein:
   the design parameter includes a round-trip loss for the laser cavity; and
   the round-trip loss decreases along the amplifying path.

7. The device of claim 6 wherein:
   the design parameter includes a round-trip reflectivity for the laser cavity; and
   the round-trip reflectivity increases along the amplifying path.

8. The device of claim 2 wherein:
   the varying lasing SOA device is characterized by an overall gain and an overall saturable power; and
   the variation of the design parameter along the amplifying path results in better noise performance relative to a non-varying lasing SOA device with the same overall gain and the same overall saturable power but in which the design parameter does not vary along the amplifying path.

9. The device of claim 2 wherein the varying lasing SOA device is for amplifying optical signals having a wavelength in a range of about 1.2 to 1.7 microns.

10. The device of claim 2 wherein the pump input comprises a plurality of electrical contacts for injecting a plurality of pump currents into the semiconductor gain medium.

11. The device of claim 2 wherein the laser cavity is oriented vertically with respect to the amplifying path.

12. The device of claim 11 wherein:
   the semiconductor gain medium forms a portion of a waveguide for the optical signal propagating along the amplifying path;
   the laser cavity comprises a first and a second mirror disposed to form a laser cavity oriented vertically with respect to the amplifying path;
   the design parameter includes a cross-sectional size of the laser cavity; and
   the cross-sectional size increases along the amplifying path.

13. The device of claim 6 wherein:
   the round-trip loss includes a round-trip diffraction loss; and
   the round-trip diffraction loss decreases along the amplifying path.

14. The device of claim 6 wherein:
   the round-trip loss includes a round-trip scattering loss; and
   the round-trip scattering loss decreases along the amplifying path.

15. The device of claim 6 wherein:
   the round-trip loss includes a round-trip absorption loss; and
   the round-trip absorption loss decreases along the amplifying path.

16. The device of claim 10, wherein the plurality of electrical contacts are pumped with a plurality of different voltages.

17. The device of claim 10, wherein the plurality of electrical contacts are pumped with a plurality of different powers.

18. The device of claim 12 further comprising:
   an aperture having a width;
   wherein the design parameter includes an aperture width; and
   wherein the aperture width increases along the amplifying path.

19. In a varying lasing semiconductor optical amplifier (SOA) device comprising a semiconductor gain medium and a laser cavity including the semiconductor gain medium, a method for amplifying an optical signal comprising:
   receiving an optical signal;
   propagating the optical signal along an amplifying path in the semiconductor gain medium;
   varying a design parameter along the amplifying path; and
   pumping the semiconductor gain medium above a lasing threshold for the laser cavity,
      whereby a gain of the semiconductor gain medium is clamped to a gain value which is substantially independent of an amplitude of the optical signal propagating along the amplifying path.

20. The method of claim 19 further comprising the step of orienting the laser cavity off-axis with respect to the amplifying path.

21. The method of claim 20 wherein
   the design parameter includes a noise figure; and
   the step of varying the design parameter comprises increasing the noise figure along the amplifying path.

22. The method of claim 20 wherein:

the design parameter includes a carrier density at a lasing threshold; and the step of varying the design parameter comprises decreasing the carrier density at the lasing threshold along the amplifying path.

23. The method of claim 20 wherein:

the design parameter includes a saturable power; and the step of varying the design parameter comprises increasing the saturable power along the amplifying path.

24. The method of claim 20 wherein:

the design parameter includes a round-trip loss for the laser cavity; and the step of varying the design parameter comprises decreasing the round-trip loss along the amplifying path.

25. The method of claim 24 wherein:

the step of varying the design parameter comprises increasing a cross-sectional size of the laser cavity along the amplifying path.

26. The method of claim 20 wherein:

the steps of propagating the optical signal along an amplifying path is characterized by an overall gain and an overall saturable power; and the step of varying the design parameter results in better noise performance relative to a non-varying lasing SOA device with the same overall gain and the same overall saturable power but in which the design parameter does not vary along the amplifying path.

27. The method of claim 20 wherein the step of receiving an optical signal comprises receiving an optical signal having a wavelength in a range of about 1.2 to 1.7 microns.

28. The method of claim 20 wherein:

the step of pumping the semiconductor gain medium comprises injecting a plurality of pump currents into the semiconductor gain medium.

29. The method of claim 20 further comprising orienting the laser cavity vertically with respect to the amplifying path.

30. The device of claim 17, wherein the plurality of different powers increase along the amplifying path.

31. The method of claim 24 wherein:

the round-trip loss includes a round-trip diffraction loss; and the round-trip diffraction loss decreases along the amplifying path.

32. The method of claim 24 wherein:

the round-trip loss includes a round-trip scattering loss; and the round-trip scattering loss decreases along the amplifying path.

33. The method of claim 24 wherein:

the round-trip loss includes a round-trip absorption loss; and the round-trip absorption loss decreases along the amplifying path.

34. The method of claim 25 wherein the design parameter includes an aperture width, and the aperture width increases along the amplifying path.

35. The method of claim 28, wherein the plurality of pump currents have a plurality of different voltages.

36. The method of claim 28, wherein the plurality of pump currents have a plurality of different powers.

37. The method of claim 36, wherein the plurality of different powers increase along the amplifying path.

* * * * *